(12) United States Patent
Kim et al.

(10) Patent No.: US 10,824,269 B2
(45) Date of Patent: Nov. 3, 2020

(54) TOUCH SENSOR AND DISPLAY DEVICE

(71) Applicant: Samsung Display Co., Ltd., Yongin-si (KR)

(72) Inventors: Ga Young Kim, Hwaseong-si (KR); In Young Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/583,840

(22) Filed: Sep. 26, 2019

(65) Prior Publication Data

US 2020/0142563 A1    May 7, 2020

(30) Foreign Application Priority Data

Nov. 6, 2018  (KR) .......................... 10-2018-0135096

(51) Int. Cl.
| | | |
|---|---|---|
| *G06F 3/041* | (2006.01) | |
| *H01L 27/32* | (2006.01) | |
| *G06F 3/044* | (2006.01) | |

(52) U.S. Cl.
CPC ........ *G06F 3/04164* (2019.05); *G06F 3/0412* (2013.01); *G06F 3/0418* (2013.01); *G06F 3/0446* (2019.05); *H01L 27/323* (2013.01); *G06F 2203/04112* (2013.01); *H01L 27/3244* (2013.01)

(58) Field of Classification Search
CPC ...... G06F 3/041–047; G06F 2203/041–04114; G06F 3/04164
See application file for complete search history.

(56) References Cited

U.S. PATENT DOCUMENTS

| | | |
|---|---|---|
| 10,019,120 B2 | 7/2018 | Jeong et al. |
| 2018/0224984 A1 | 8/2018 | Kim et al. |
| 2018/0329555 A1 | 11/2018 | Kim et al. |

FOREIGN PATENT DOCUMENTS

| | | |
|---|---|---|
| KR | 20160122900 | 10/2016 |
| KR | 2018-0090936 | 8/2018 |
| KR | 20180125672 | 11/2018 |

*Primary Examiner* — Sanjiv D. Patel
(74) *Attorney, Agent, or Firm* — H. C. Park & Associates

(57) ABSTRACT

A touch sensor including a base layer, a first touch electrode member including first touch electrodes disposed on the base layer, arranged along a first direction, electrically connected to each other, and each including a first opening, a second touch electrode member including second touch electrodes disposed on the base layer, arranged along a second direction, and electrically connected to each other, a conductive member including conductive patterns electrically connected to each other along the first direction and respectively disposed in the first openings, a contact electrode connected to one end of the first touch electrode member and including lower and upper contact electrodes, and a connection pattern connected to an outermost first conductive pattern, the connection pattern including the same conductive layer as the upper contact electrode, in which the upper contact electrode includes an electrode opening, and a portion of the connection pattern is disposed therein.

20 Claims, 32 Drawing Sheets

TOUCH SENSOR AND DISPLAY DEVICE

CROSS REFERENCE TO RELATED APPLICATION

This application claims priority from and the benefit of Korean Patent Application No. 10-2018-0135096, filed on Nov. 6, 2018, which is hereby incorporated by reference for all purposes as if fully set forth herein.

BACKGROUND

Field

Exemplary embodiments of the invention relate generally to a touch sensor and a display device.

Discussion of the Background

Electronic devices that provide images to a user, such as a smartphone, a tablet PC, a digital camera, a notebook computer, a navigation system, and a smart television, include a display device for displaying images. The display device includes a display panel that generates and displays an image and various input devices.

Recently, a touch sensor that recognizes a touch input has been widely applied to display devices mainly in smartphones and tablet PCs. Due to the convenience of a touch method, a touch sensor is rapidly replacing an existing physical input device, such as a keypad.

The above information disclosed in this Background section is only for understanding of the background of the inventive concepts, and, therefore, it may contain information that does not constitute prior art.

SUMMARY

A touch sensor constructed according to exemplary embodiments of the invention and a display device including the same provide improved sensitivity.

Additional features of the inventive concepts will be set forth in the description which follows, and in part will be apparent from the description, or may be learned by practice of the inventive concepts.

A touch sensor according to an exemplary embodiment includes a base layer, a first touch electrode member including a plurality of first touch electrodes disposed on the base layer, the first touch electrodes arranged along a first direction and electrically connected to each other, each first touch electrode including a first opening, a second touch electrode member including a plurality of second touch electrodes disposed on the base layer, the second touch electrodes arranged along a second direction intersecting the first direction and electrically connected to each other, a conductive member including a plurality of conductive patterns electrically connected to each other along the first direction and respectively disposed in the first openings, a contact electrode connected to one end of the first touch electrode member and including a lower contact electrode and an upper contact electrode, and a connection pattern connected to a first conductive pattern of the conductive patterns disposed at an outermost position along the first direction, the connection pattern including the same conductive layer as the upper contact electrode, in which the upper contact electrode includes an electrode opening, and a portion of the connection pattern is disposed in the electrode opening.

A touch sensor according to another exemplary embodiment includes a base layer, a first touch electrode member including a plurality of first touch electrodes disposed on the base layer, the first touch electrodes arranged along a first direction and electrically connected to each other, each first touch electrode including a first opening, a second touch electrode member including a plurality of second touch electrodes disposed on the base layer, the second touch electrodes arranged along a second direction intersecting the first direction and electrically connected to each other, a conductive member including a plurality of conductive patterns electrically connected to each other along the first direction and respectively disposed in the first openings, a contact electrode connected to one end of the first touch electrode member and including a lower contact electrode and an upper contact electrode, and a connection pattern connected to a first conductive pattern of the conductive patterns disposed at an outermost position along the first direction, the connection pattern including the same conductive layer as the lower contact electrode, in which the lower contact electrode includes an electrode opening, and a portion of the connection pattern is disposed in the electrode opening.

A display device according to an exemplary embodiment includes a base substrate including a sensing area and a peripheral area, a light emitting element disposed on the base substrate, an inorganic layer disposed on the light emitting element, a touch electrode disposed on the inorganic layer in the sensing area, the touch electrode being disposed within the sensing area and including an opening, a conductive member including a conductive pattern located within the opening in the sensing area and spaced apart from the touch electrode, a touch signal wiring disposed on the inorganic layer in the peripheral area and electrically connected to the touch electrode, and a conductive member connecting wiring disposed on the inorganic layer in the peripheral area, electrically connected to the conductive pattern, and intersecting the touch signal wiring, in which the touch signal wiring includes an upper wiring including the same first conductive layer as the touch electrode and the conductive pattern, and a lower wiring including a second conductive layer different from the first conductive layer, the lower wiring disposed directly on the inorganic layer, any one of the upper wiring and the lower wiring includes a wiring opening, and at least a portion of the conductive member connecting wiring is disposed in the wiring opening and is insulated from the touch signal wiring.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
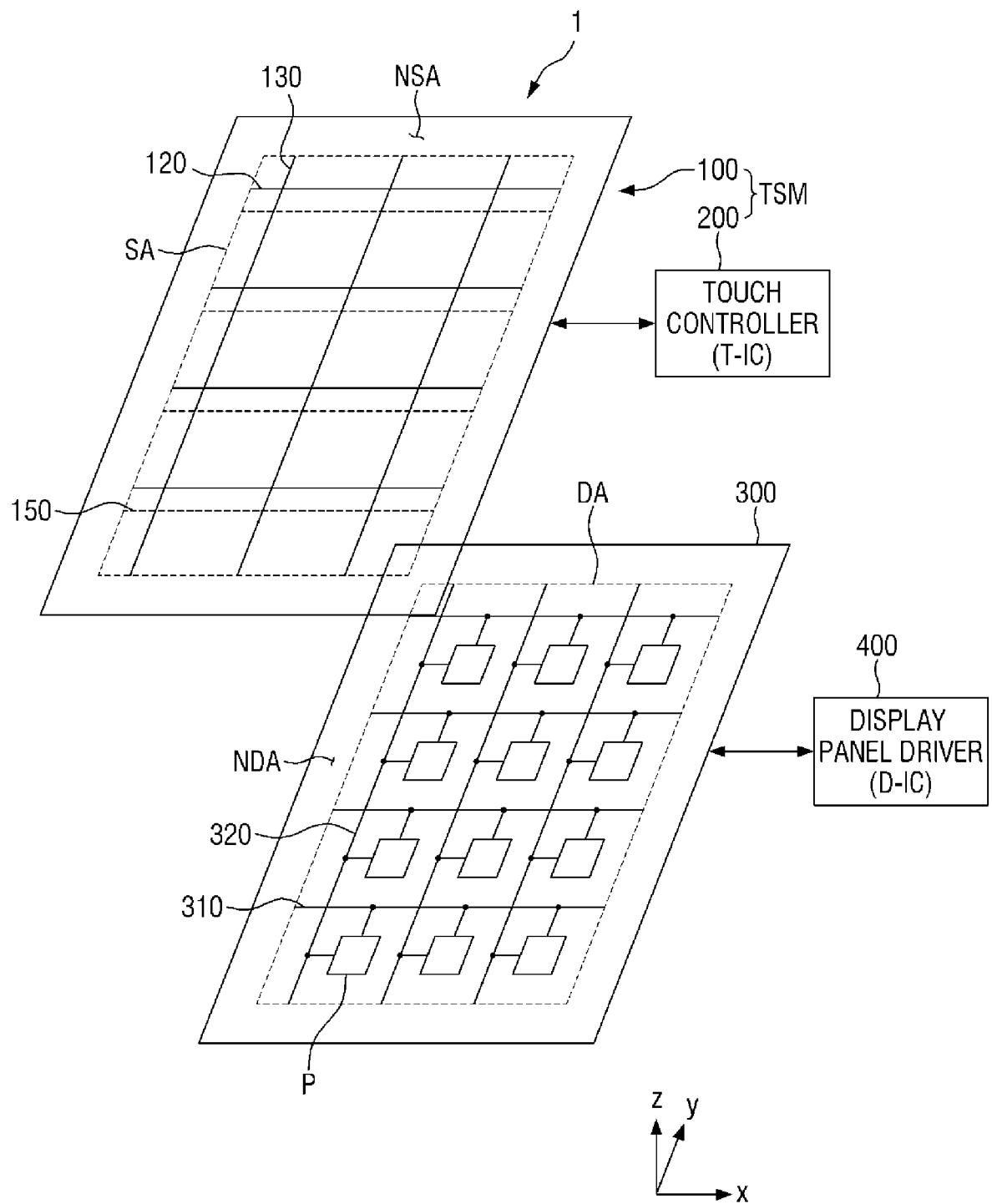
FIG. 1 is a schematic diagram of a display device including a touch sensor according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
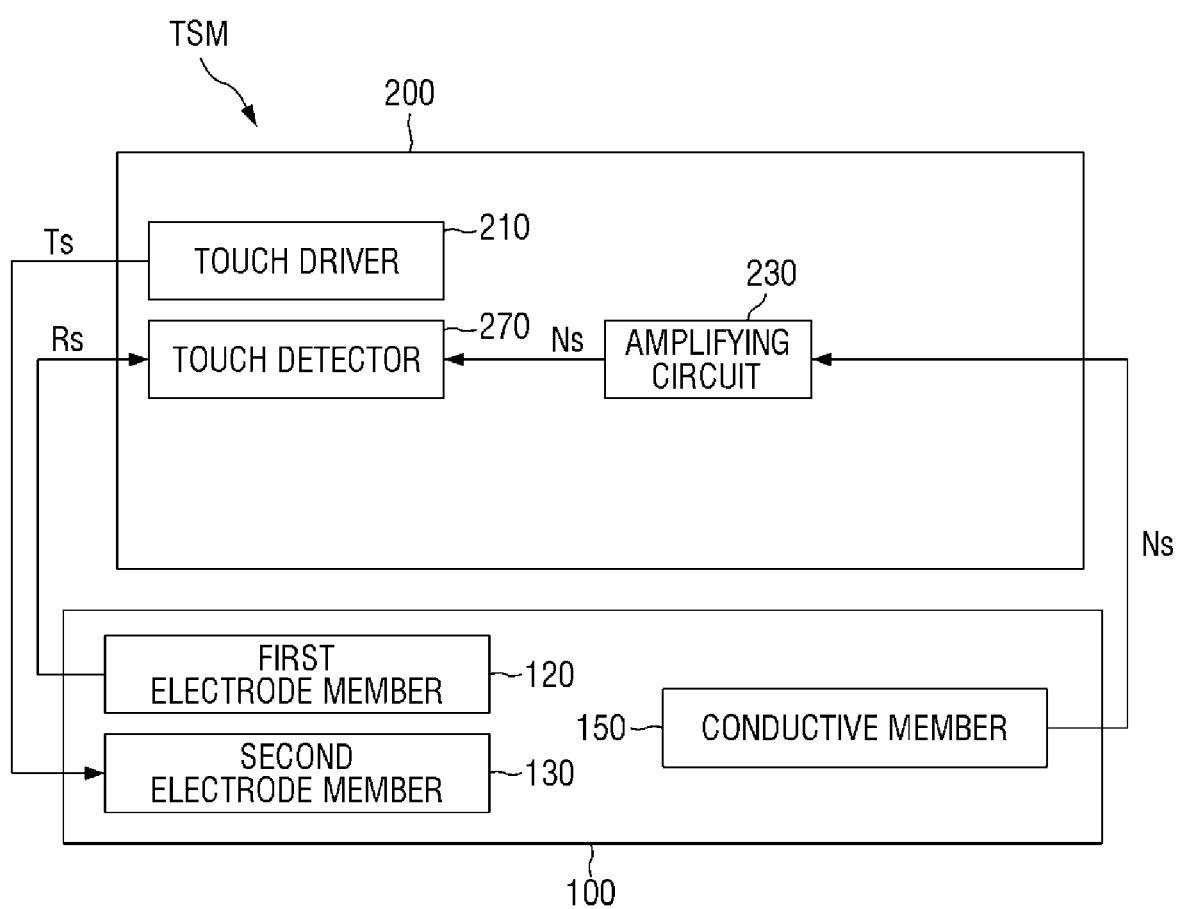
FIG. 2 is a block diagram of a touch sensor according to an exemplary embodiment.

FIG. 1 is a schematic diagram of a display device including a touch sensor according to an exemplary embodiment, and FIG. 2 is a block diagram of a touch sensor of FIG. 1.

Referring to FIGS. 1 and 2, the display device 1 according to an exemplary embodiment includes the touch sensor TSM and a display panel 300, and may further include a display panel driver 400. The touch sensor TSM includes a sensor unit 100 and a touch controller 200.

Although the sensor unit 100 and the display panel 300 are illustrated as being separated from each other in FIG. 1, however, the inventive concepts are not limited thereto. For example, the sensor unit 100 and the display panel 300 may be formed integrally with each other.

The display panel 300 includes a display area DA and a non-display area NDA surrounding at least one side of the display area DA. The display area DA includes a plurality of scan lines 310 and a plurality of data lines 320, and a plurality of pixels P connected to the scan lines 310 and the data lines 320. The non-display area NDA may include various driving signals for driving the pixels P and/or wirings for supplying driving power.

As used herein, the display panel 300 it not limited to a particular type of a display panel. For example, the display panel 300 may be a self-luminous display panel, such as an organic light emitting display panel, a quantum dot light emitting display (QLED) panel, a micro-light emitting diode (LED) display panel, a nano-LED display panel. Alternatively, the display panel 300 may be a non-luminous display panel, such as a liquid crystal display (LCD) panel, an electrophoretic display (EPD) panel, or an electrowetting display (EWD) panel. When the display panel 300 is a non-luminous display panel, the display device 1 may further include a backlight unit for supplying light to the display panel 300. Hereinafter, the display panel 300 will be described with reference to an organic light emitting display panel according to an exemplary embodiment.

The display panel driver 400 is electrically connected to the display panel 300 to supply signals necessary for driving the display panel 300. For example, the display panel driver 400 may include at least one of a scan driver for supplying scan signals to the scan lines 310, a data driver for supplying data signals to the data lines 320, and a timing controller for driving the scan driver and the data driver. According to an exemplary embodiment, the scan driver, the data driver, and/or the timing controller may be integrated into one display integrated circuit (D-IC). Alternatively, in another exemplary embodiment, at least one of the scan driver, the data driver, and the timing controller may be integrated or mounted on the display panel 300.

The sensor unit 100 may be provided on at least one area of the display panel 300. For example, the sensor unit 100 may be provided on at least one surface of the display panel 300 to overlap the display panel 300. For example, the sensor unit 100 may be disposed on a surface (e.g., an upper surface) of the display panel 300 displaying an image, among both surfaces of the display panel 300. Alternatively, the sensor unit 100 may be formed directly on at least one of both surfaces of the display panel 300, or may be formed inside the display panel 300. For example, the sensor unit 100 may be formed directly on an outer surface of an upper substrate (or a thin-film encapsulation layer) or a lower substrate (e.g., an upper surface of the upper substrate or a lower surface of the lower substrate) of the display panel 300, or may be formed directly on an inner surface of the upper substrate or the lower substrate (e.g., a lower surface of the upper substrate or an upper surface of the lower substrate).

The sensor unit 100 includes a sensing area SA and a peripheral area NSA surrounding at least a part of the sensing area SA. In some exemplary embodiments, the sensing area SA may be an area of the sensor unit 100 which senses a touch input, and the peripheral area NSA may be an area of the sensor unit 100 which cannot sense a touch input. According to an exemplary embodiment, the sensing area SA may be disposed to correspond to the display area DA of the display panel 300, and the peripheral area NSA may be disposed to correspond to the non-display area NDA of the display panel 300. For example, the sensing area SA of the sensor unit 100 may overlap the display area DA of the display panel 300, and the peripheral area NSA of the sensor unit 100 may overlap the non-display area NDA of the display panel 300.

A plurality of first touch electrode members 120 for detecting a touch input and a plurality of second touch electrode members 130 for detecting a touch input may be provided in the sensing area SA of the sensor unit 100.

The first touch electrode members 120 may substantially extend along a first direction x and may be spaced apart from each other along a second direction y intersecting the first direction x. More particularly, the first touch electrode members 120 substantially extending in the first direction x may be spaced apart from each other along the second direction y to form electrode rows.

The second touch electrode members 130 may substantially extend along the second direction y and may be spaced apart from each other along the first direction x. The second touch electrode members 130 may be spaced apart from the first touch electrode members 120 and may be insulated from the first touch electrode members 120. More particularly, the second touch electrode members 130 substantially extending in the second direction y may be spaced apart from each other along the first direction x to form columns.

Figure 4:
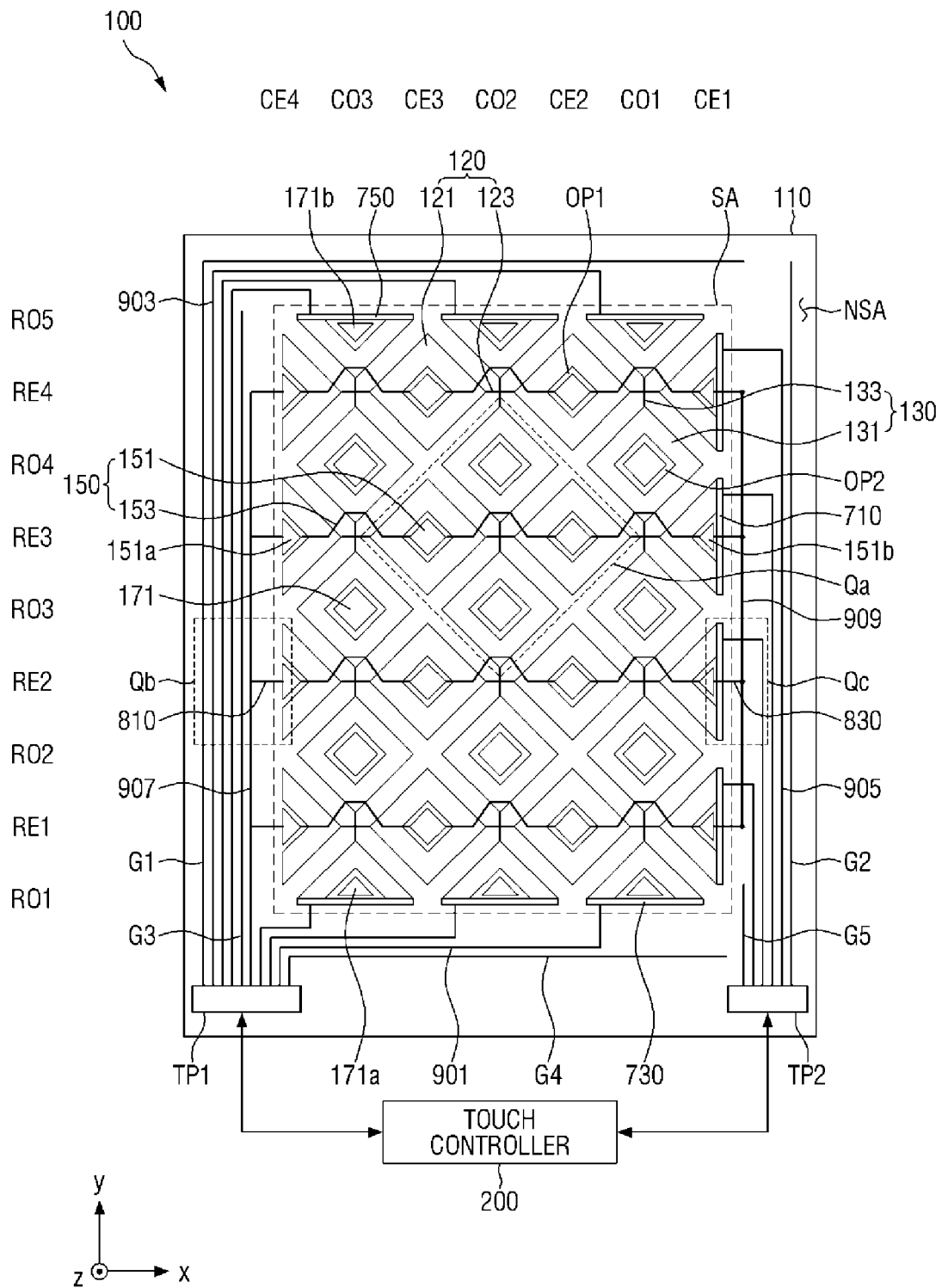
FIG. 4 is a plan view of the sensor unit of the touch sensor according to an exemplary embodiment.

The shapes, sizes, and/or arrangement directions of the first touch electrode members 120 and the second touch electrode members 130 are not particularly limited. According to an exemplary embodiment, the first touch electrode members 120 and the second touch electrode members 130 may be configured as illustrated in FIG. 4, which will be described later.

The first touch electrode members 120 and the second touch electrode members 130 may be electrically connected to the touch controller 200. In some exemplary embodiments, each of the second touch electrode members 130 may be a driving electrode member that receives a driving signal Ts for touch detection from the touch controller 200, and each of the first touch electrode members 120 may be a sensing electrode member that outputs a sensing signal Rs for touch detection to the touch controller 200.

The first touch electrode members 120 and the second touch electrode members 130 may overlap at least one electrode of the display panel 300. For example, when the display panel 300 is an organic light emitting display panel, the first touch electrode members 120 and the second touch electrode members 130 may overlap a cathode of the display panel 300.

A plurality of conductive members 150 may be provided in the sensing area SA of the sensor unit 100. Each of the conductive members 150 may sense a noise generated by the sensor unit 100, and provide the sensed noise to a touch detector 270 as a noise signal Ns. The conductive members 150 may be spaced apart from the first touch electrode members 120 and the second touch electrode members 130, and may be insulated from the first touch electrode members 120 and the second touch electrode members 130.

In some exemplary embodiments, the conductive members 150 may substantially extend along the first direction x and may be spaced apart from each other along the second direction y intersecting the first direction x. The conductive members 150 will be described in more detail later.

The touch controller 200 may be electrically connected to the sensor unit 100 to supply the driving signal Ts to the sensor unit 100, and may detect a touch position by receiving the sensing signal Rs corresponding to the driving signal Ts from the sensor unit 100.

In some exemplary embodiments, the touch controller 200 may include a touch driver 210 and the touch detector 270. In addition, the touch controller 200 may further include an amplifying circuit 230.

The touch driver 210 may provide the driving signal Ts for detecting a touch input to each of the second touch electrode members 130.

The touch detector 270 may detect the presence or absence of a touch input and/or the position of the touch input by receiving the sensing signal Rs corresponding to the driving signal Ts from each of the first touch electrode members 120 during a period in which a touch sensing operation is performed. In some exemplary embodiments, the sensing signal Rs may be a change in mutual capacitance between a first touch electrode member 120 and a second touch electrode member 130. More specifically, when a touch input occurs, the mutual capacitance is changed at the position of the touch input or around the position of the touch input. The touch detector 270 may receive a change in mutual capacitance between a first touch electrode member 120 and a second touch electrode member 130 as the sensing signal Rs, and detect the presence or absence and/or position of a touch input by using the sensing signal Rs. In addition, the touch detector 270 may receive the noise signal Ns from each of the conductive members 150, and remove or cancel noise included in the sensing signal Rs by using the noise signal Ns.

In some exemplary embodiments, the touch detector 270 may include at least one amplifier for amplifying a received sensing signal Rs, an analog-digital converter (ADC) connected to an output terminal of the amplifier, and a processor. This will be described in more detail later with reference to FIGS. 37 and 38.

The amplifying circuit 230 is connected to the conductive members 150 and the touch detector 270. The amplifying circuit 230 may amplify the noise signal Ns provided by each of the conductive members 150 or adjust a gain value of the noise signal Ns, and then provide the noise signal Ns to the touch detector 270.

In some exemplary embodiments, the touch driver 210, the touch detector 270, and the amplifying circuit 230 may be integrated into one touch IC. In some exemplary embodiments, some of the touch driver 210, the touch detector 70, and the amplifying circuit 230 may be located inside the touch IC, and the others of the touch driver 210, the touch detector 270, and the amplifying circuit 230 may be located in a portion other than the inside of the touch IC.

Figure 3:
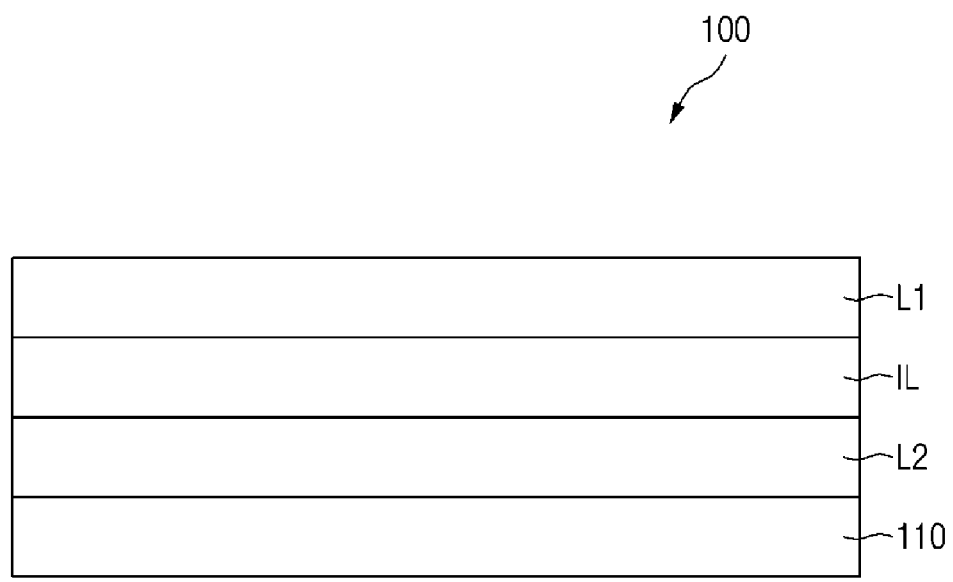
FIG. 3 is a schematic view of a sensor unit of the touch sensor according to an exemplary embodiment.

FIG. 3 is a schematic view of the sensor unit 100 of the touch sensor TSM illustrated in FIGS. 1 and 2.

Referring to FIG. 3, the sensor unit 100 may include a base layer 110, an insulating layer IL, a first conductive layer L1, and a second conductive layer L2.

The second conductive layer L2 may be disposed on the base layer 110, and the first conductive layer L1 may be disposed on the second conductive layer L2. The insulating layer IL may be disposed between the first conductive layer L1 and the second conductive layer L2.

The base layer 110 may be a layer serving as a base of the sensor unit 100. In some exemplary embodiments, the base layer 110 may be one of the layers forming the display panel 300. In an exemplary embodiment in which the sensor unit 100 and the display panel 300 are formed integrally with each other, the base layer 110 may be at least one of the layers forming the display panel 300. For example, the base layer 110 may be a thin-film encapsulation layer of the display panel 300. Alternatively, the base layer 110 may be a rigid substrate or a flexible substrate in some exemplary embodiments. For example, the base layer 110 may be a rigid substrate made of glass or tempered glass or a flexible substrate made of a thin film of a flexible plastic material. Hereinafter, the base layer 110 will be described with reference to a layer including at least one of the layers forming the display panel 300, such as a thin film encapsulation layer.

Each of the first conductive layer L1 and the second conductive layer L2 may include a conductive material. Examples of the conductive material may include metals and an alloy thereof. Examples of the metals may include gold (Au), silver (Ag), aluminum (Al), molybdenum (Mo), chromium (Cr), titanium (Ti), nickel (Ni) neodymium (Nd), copper (Cu), and platinum (Pt). Each of the first conductive layer L1 and the second conductive layer L2 may also include a transparent conductive material. Examples of the transparent conductive material may include silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nanotube, and graphene.

At least any one of the first conductive layer L1 and the second conductive layer L2 may include a conductive layer having a multilayer structure. For example, at least any one of the first conductive layer L1 and the second conductive layer L2 may have a three-layer structure of Ti/Al/Ti. As another example, at least any one of the first conductive layer L1 and the second conductive layer L2 may include at least one metal layer and at least one transparent conductive layer.

In some exemplary embodiments, the first conductive layer L1 and the second conductive layer L2 may include the same material. For example, the first conductive layer L1 and the second conductive layer L2 may all include aluminum. In an exemplary embodiment, the first conductive layer L1 and the second conductive layer L2 may have a three-layer structure of Ti/Al/Ti.

In some exemplary embodiments, the first conductive layer L1 and the second conductive layer L2 may include different materials. For example, the first conductive layer L1 may include metal, and the second conductive layer L2 may include a transparent conductive layer. Alternatively, the first conductive layer L1 and the second conductive layer L2 may include different metals.

The insulting layer IL may be disposed between the second conductive layer L2 and the first conductive layer L1 to insulate the second conductive layer L2 from the first conductive layer L1. The insulating layer IL may include an insulating material. In some exemplary embodiments, the insulating material may be an inorganic insulating material or an organic insulating material. The inorganic insulating material may include at least one of aluminum oxide, titanium oxide, silicon oxide, silicon oxynitride, zirconium oxide, and hafnium oxide. The organic insulating material may include at least any one of acrylic resin, methacrylic resin, polyisoprene, vinyl resin, epoxy resin, urethane resin, cellulose resin, siloxane resin, polyimide resin, polyamide resin, and perylene resin.

The touch sensor TSM according to an exemplary embodiment will now be described in more detail with reference to FIGS. 4 to 11.

Figure 5:
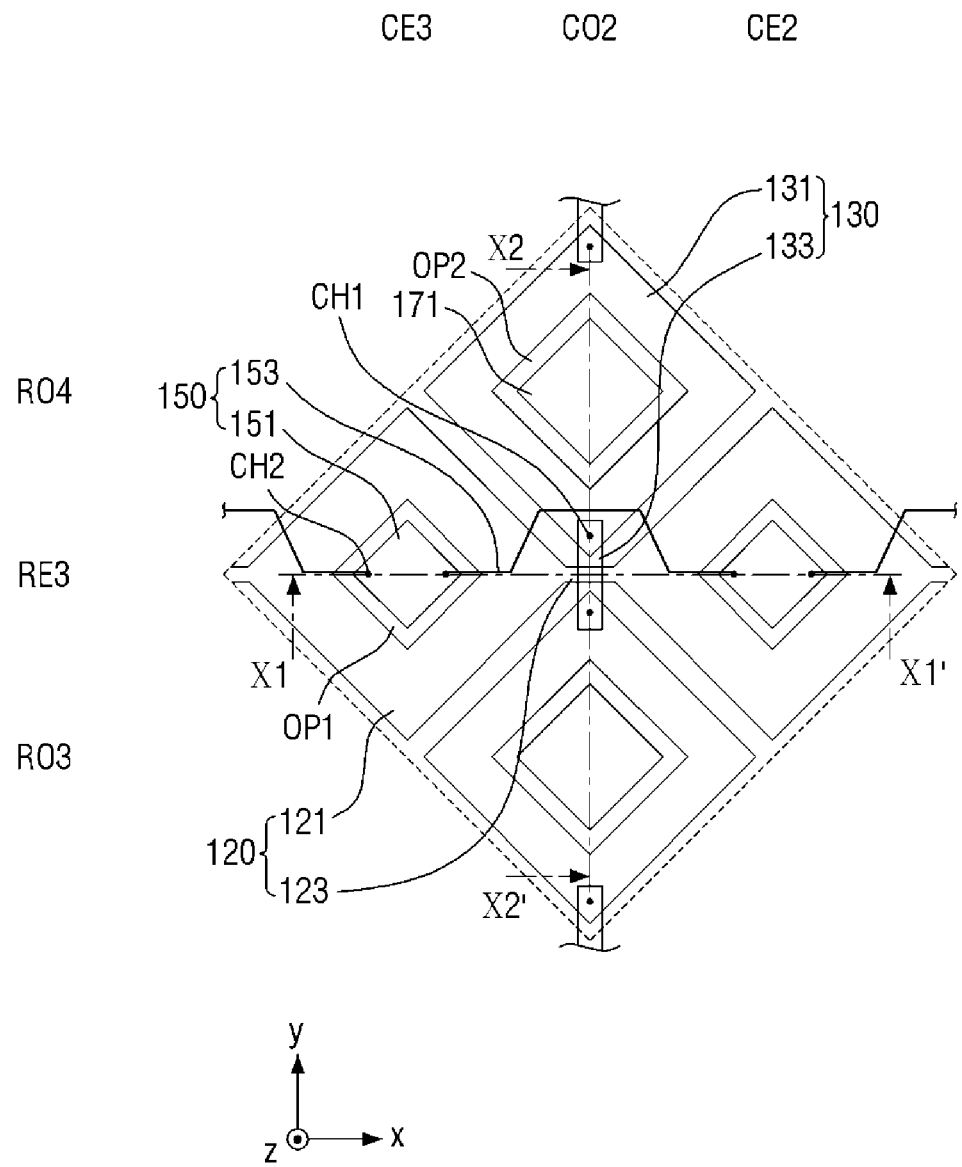
FIG. 5 is an enlarged plan view of portion Qa of FIG. 4 according to an exemplary embodiment.
Figure 6:
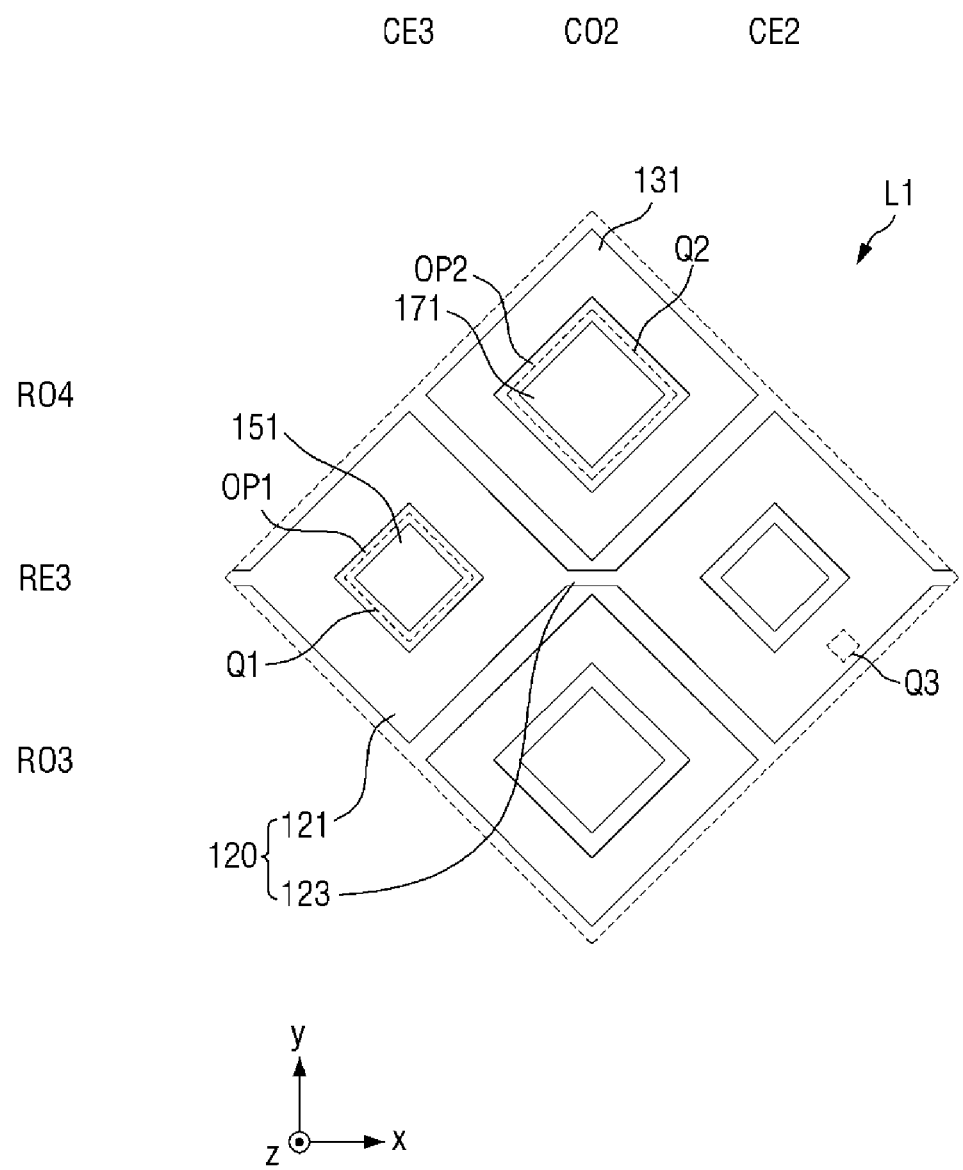
FIG. 6 illustrates components made of a first conductive layer in the sensor unit of FIG. 5.
Figure 7:
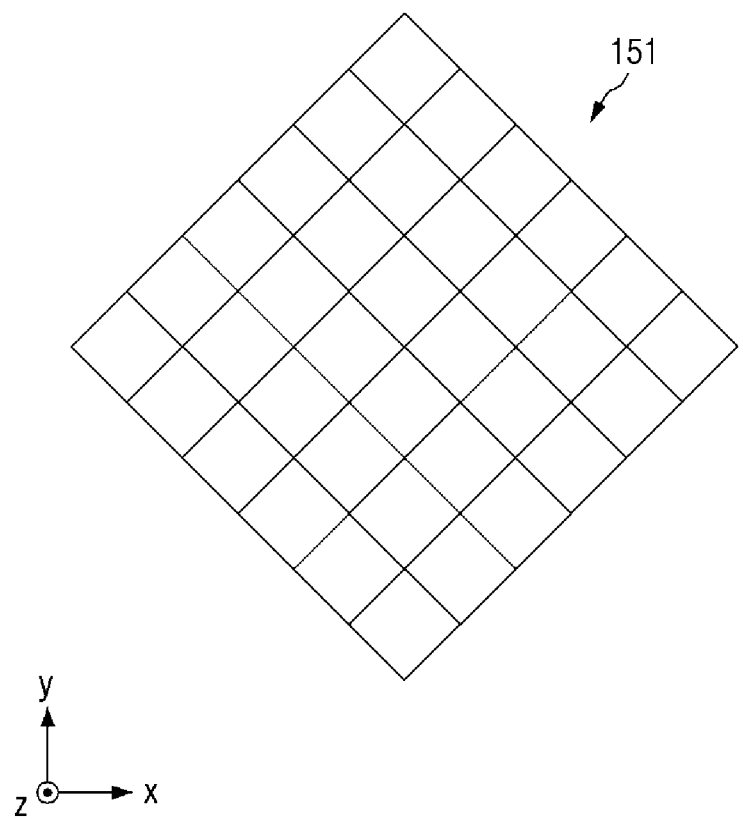
FIG. 7 is an enlarged plan view of portion Q1 of FIG. 6.
Figure 8:
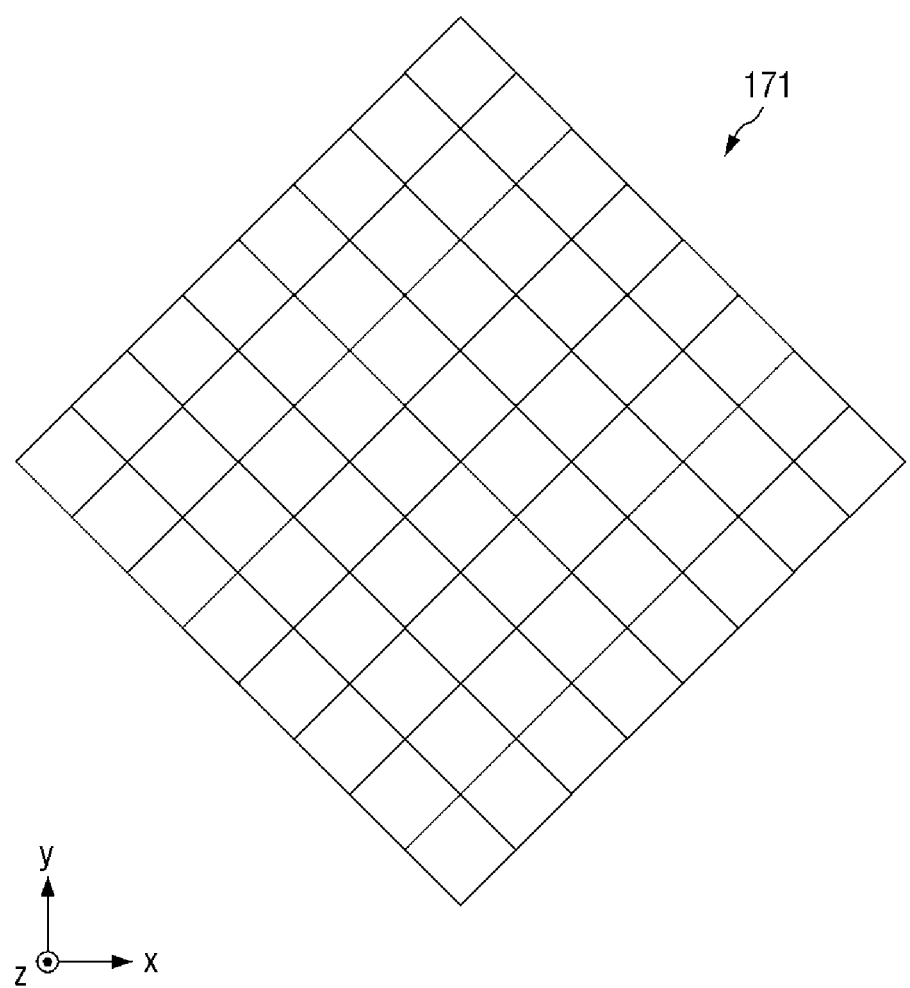
FIG. 8 is an enlarged plan view of portion Q2 of FIG. 6.
Figure 9:
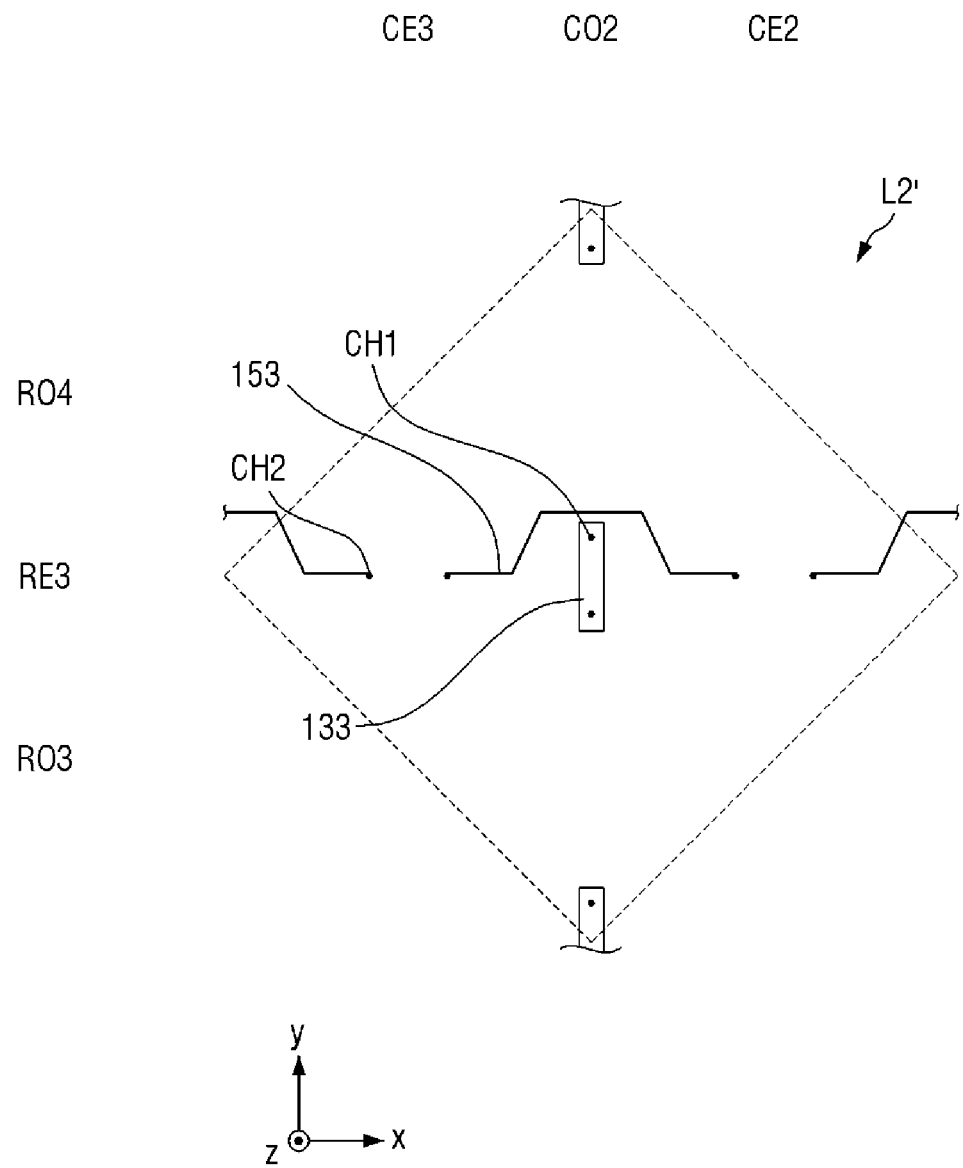
FIG. 9 illustrates components made of a second conductive layer in the sensor unit of FIG. 5.
Figure 10:
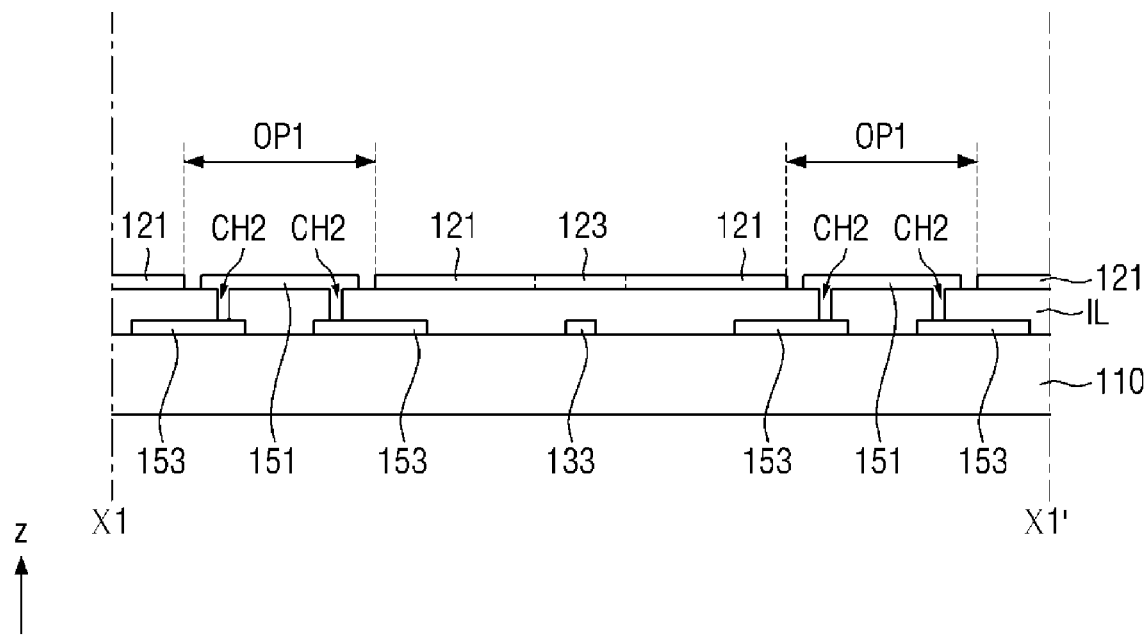
FIG. 10 is a cross-sectional view taken along X1-X1' of FIG. 5.
Figure 11:
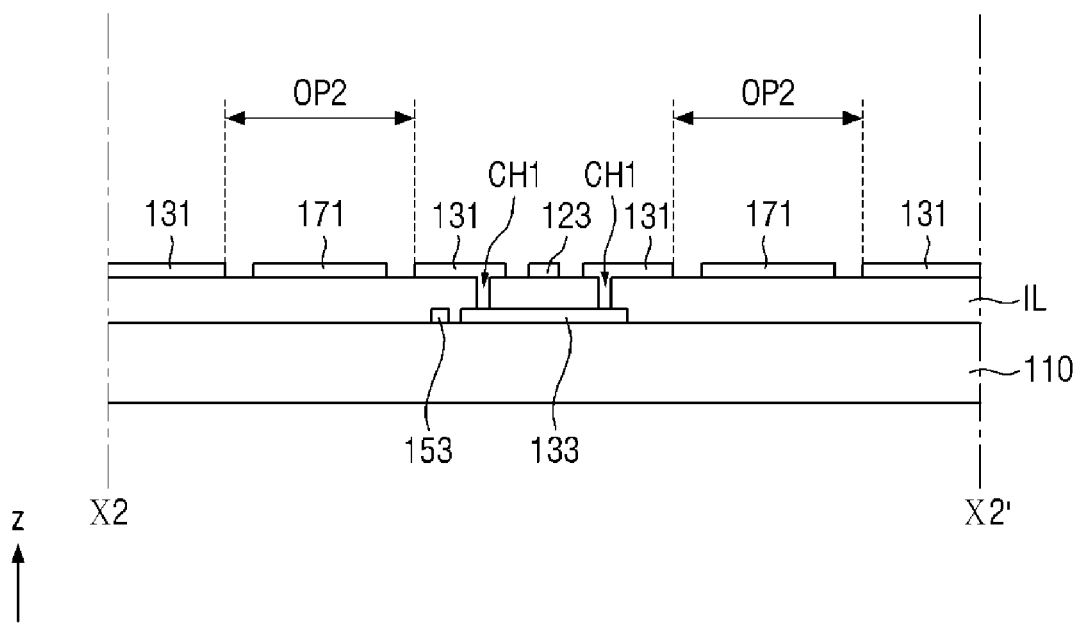
FIG. 11 is a cross-sectional view taken along X2-X2' of FIG. 5.

FIG. 4 illustrates the touch sensor TSM of FIG. 2, a plan view of the sensor unit 100 of the touch sensor TSM, and the connection relationship between the sensor unit 100 and the touch controller 200 according to an exemplary embodiment. FIG. 5 is an enlarged plan view of portion Qa of FIG. 4 according to an exemplary embodiment. FIG. 6 illustrates components made of the first conductive layer L1 in the sensor unit 100 of FIG. 5. FIG. 7 is an enlarged plan view of portion Q1 of FIG. 6 according to an exemplary embodiment. FIG. 8 is an enlarged plan view of portion Q2 of FIG. 6 according to an exemplary embodiment. FIG. 9 illustrates components made of the second conductive layer L2 in the sensor unit 100 of FIG. 5, together with the position of contact holes. FIG. 10 is a cross-sectional view taken along X1-X1' of FIG. 5 according to an exemplary embodiment. FIG. 11 is a cross-sectional view taken along X2-X2' of FIG. 5 according to an exemplary embodiment.

Referring to FIGS. 4 through 11, the sensor unit 100 includes the base layer 110, the first touch electrode members 120, the second touch electrode members 130, the conductive members 150, and wirings 901, 903, 905, 907 and 909, and may further include conductors 171, contact electrodes 710, 730 and 750, and connection patterns 810 and 830.

The base layer 110 may include the sensing area SA and the peripheral area NSA.

Components located on the sensing area SA of the base layer 110 will now be described.

The first touch electrode members 120, the second touch electrode members 130, the conductive members 150, and the conductors 171 may be disposed on the sensing area SA of the base layer 110.

The first touch electrode members 120 may substantially extend along the first direction x and may be spaced apart from each other along the second direction y. Each of the first touch electrode members 120 spaced apart from each other along the second direction y may form an electrode row. In FIG. 4, the first touch electrode members 120 are spaced apart from each other along the second direction y to form a first electrode row RE1, a second electrode row RE2, a third electrode row RE3, and a fourth electrode row RE4. However, the inventive concepts are not limited to a particular number of rows, and the number of the first touch electrode members 120 can be variously changed.

Each of the first touch electrode members 120 may include a plurality of first touch electrodes 121 arranged along the first direction x and a plurality of first connection portions 123, each connecting the first touch electrodes 121 neighboring each other along the first direction x. As used herein, the term "connection" may encompass "connection" in physical and/or electrical aspects.

In some exemplary embodiments, as illustrated in FIG. 6, the first touch electrodes 121 may be made of the first conductive layer L1. The first touch electrodes 121 may have a substantially rhombic or square shape. However, the inventive concepts are not limited to a particular shape of the first touch electrodes 121, and the first touch electrodes 121 may have various other shapes, such as a triangle, a quadrilateral other than a rhombus, a quadrilateral other than a rhombus, a quadrilateral other than a square, a pentagon, a circle, and a bar.

In some exemplary embodiments, the first touch electrodes 121 may have a mesh structure so as not to be visible to a user. When the first touch electrodes 121 have a mesh structure, they may be arranged to not overlap light emitting areas of the display panel 300. In particular, mesh holes, each overlapping a light emitting area, may be defined in each of the first touch electrodes 121 having the mesh structure.

In some exemplary embodiments, the first touch electrodes 121 spaced apart from each other along the first direction x and neighboring each other along the second direction y may form electrode columns. FIG. 4 illustrates four first touch electrodes 121 disposed in one column, and the first touch electrodes 121 arranged along the second direction y form a first electrode column CE1, a second electrode column CE2, a third electrode column CE3, and a fourth electrode column CE4. However, the inventive concepts are not limited thereto, and the number of electrode columns formed by the first touch electrodes 121 can be variously changed.

Each of the first touch electrodes 121 may include a first opening OP1. For example, at least a central portion of each of the first touch electrodes 121 may be opened to expose a layer located under the first touch electrode 121. For example, when the insulating layer IL is located under the first touch electrodes 121 as illustrated in FIG. 10, a portion of the insulating layer IL may be exposed through each of the first openings OP1.

In some exemplary embodiments, first touch electrodes 121 located closest to the peripheral area NSA along the first direction x among the first touch electrodes 121 may have a different shape from other first touch electrodes 121. For example, each first touch electrode 121 located in the fourth electrode column CE4 and the first electrode column CE1 may have the shape of a portion of each first touch electrode 121 located in the second electrode column CE2 or the third electrode column CE3.

Each of the first connection portions 123 may electrically connect the first touch electrodes 121 located in the same electrode row and neighboring each other along the first direction x, and may contact the first touch electrodes 121. In some exemplary embodiments, as illustrated in FIG. 6, the first connection portions 123 may be made of the first conductive layer L1, like the first touch electrodes 121.

The second touch electrode members 130 may substantially extend along the second direction y and may be spaced apart from each other along the first direction x. Each of the second touch electrode members 130 spaced apart from each other along the first direction x may form a column. FIG. 4 illustrates three second touch electrode members 130 disposed along the first direction x to form a first column CO1, a second column CO2, and a third column CO3. However, the inventive concepts are not limited thereto, and the number of the second touch electrode members 130 can be variously changed.

Each of the second touch electrode members 130 may include a plurality of second touch electrodes 131 arranged along the second direction y and a plurality of second connection portions 133, each electrically connecting the second touch electrodes 131 neighboring each other along the second direction y.

In some exemplary embodiments, the second touch electrodes 131 spaced apart from each other along the second direction y and adjacent to each other along the first direction x may form rows. In FIG. 4, three second touch electrodes 131 are disposed in one column, and the second touch electrodes 131 arranged along the second direction y form a first row RO1, a second row RO2, a third row RO3, a fourth row RO4, and a fifth row RO5. However, the inventive concepts are not limited thereto, and the number of rows formed by the second touch electrodes 131 can be variously changed.

In some exemplary embodiments, as illustrated in FIG. 6, the second touch electrodes 131 may be made of the first conductive layer L1, like the first touch electrodes 121. The second touch electrodes 131 may have a substantially rhombic or square planar shape. However, the inventive concepts are not limited to a particular shape of the second touch electrodes 131, and the second touch electrodes 131 may have various other shapes, such as a triangle, a quadrilateral other than a rhombus, a pentagon, a circle, and a bar.

In some exemplary embodiments, when the first touch electrodes 121 have a mesh structure, the second touch electrodes 131 may also have a mesh structure.

Each of the second touch electrodes 131 may include a second opening OP2. For example, at least a central portion of each of the second touch electrodes 131 may be opened to expose a layer located under the second touch electrode 131. For example, when the insulating layer IL is located under the second touch electrodes 131 as illustrated in FIG. 11, a portion of the insulating layer IL may be exposed through each of the second openings OP2.

In some exemplary embodiments, the area of each of the second openings OP2 may be different from the area of each of the first openings OP1. For example, the area of each of the second openings OP2 may be larger than the area of each of the first openings OP1.

In some exemplary embodiments, second touch electrodes 131 located closest to the peripheral area NSA along the second direction y among the second touch electrodes 131 may have a different shape from other second touch electrodes 131. For example, each second touch electrode 131 located in the fifth row RO5 and the first row RO1 may have the shape of a portion of each second touch electrode 131 located in the second row RO2, the third row RO3, or the fourth row RO4.

Each of the second connection portions 133 may electrically connect the second touch electrodes 131 neighboring each other along the second direction y, and may contact the second touch electrodes 131. In some exemplary embodiments, the second connection portions 133 may be made of the second conductive layer L2 as illustrated in FIG. 9. The second connection portions 133 and the second touch electrodes 131 may be connected to each other through first contact holes CH1 formed in the insulating layer IL. Alternatively, in an exemplary embodiment, the second connection portions 133 may be made of the first conductive layer L1. In this case, the first connection portions 123 may be made of the second conductive layer L2.

In some exemplary embodiments, each of the second touch electrodes 131 may be a driving electrode that receives the driving signal Ts for detecting a touch position, and each of the first touch electrodes 121 may be a sensing electrode that outputs the sensing signal Rs for detecting a touch position.

The conductive members 150 may be located in electrode rows formed by the first touch electrode members 120. In some exemplary embodiments, the conductive members 150 may be located in the first electrode row RE1, the second electrode row RE2, the third electrode row RE3, and the fourth electrode row RE4 formed by the first touch electrode members 120.

Each of the conductive members 150 may include conductive patterns 151 and connection lines 153.

The conductive patterns 151 may be located within the first openings OP1 of the first touch electrodes 121, respectively, and may be spaced apart from the first touch electrodes 121. In some exemplary embodiments, as illustrated in FIG. 6, the conductive patterns 151 may be made of the first conductive layer L1, like the first touch electrodes 121 and the second touch electrodes 131.

In some exemplary embodiments, when the first touch electrodes 121 have a mesh structure, the conductive patterns 151 may also have a mesh structure as illustrated in FIG. 7.

In some exemplary embodiments, conductive patterns located at both ends of an electrode row (e.g., conductive patterns located in outermost electrode columns) among the conductive patterns 151 located in the electrode row may be smaller than other conductive patterns. For example, when the conductive patterns 151 located in the fourth electrode column CE4 among the conductive patterns 151 are referred to as first conductive patterns 151a, and conductive patterns located in the first electrode column CE1 are referred to as second conductive patterns 151b, the first conductive patterns 151a and the second conductive patterns 151b may be smaller than conductive patterns 151 located in the second electrode column CE2 or the third electrode column CE3.

Each of the connection lines 153 may electrically connect the conductive patterns 151 located in the same electrode row and neighboring each other along the first direction x. In some exemplary embodiments, as illustrated in FIG. 9, the connection lines 153 may be made of the second conductive layer L2, like the second connection portions 133.

In some exemplary embodiments, the conductive patterns 151 and the connection lines 153 may be connected to each other through second contact holes CH2 formed in the insulating layer IL.

In some exemplary embodiments, the connection patterns 810 and 830 may be further located on the base layer 110. The connection patterns 810 and 830 may include first connection patterns 810 and second connection patterns 830.

The second connection patterns 830 may electrically connect the conductive members 150 to a conductive member connecting wiring 909, which will be described later. More specifically, the second connection patterns 830 may be connected to the second conductive patterns 151b among the conductive patterns 151 and the conductive member connecting wiring 909.

The first connection patterns 810 may electrically connect the conductive members 150 to a noise signal wiring 907, which will be described later. More specifically, the first connection patterns 810 may be connected to the first conductive patterns 151a among the conductive patterns 151 and the noise signal wiring 907.

In some exemplary embodiments, the first connection patterns 810 and the second connection patterns 830 may be made of the same conductive layer as the conductive patterns 151. For example, the first connection patterns 810 and the second connection patterns 830 may be made of the first conductive layer L1.

The conductors 171 may be located in the second openings OP2 of the second touch electrodes 131, respectively. The second openings OP2 formed in the second touch electrodes 131 may cause a difference in external light reflectance. Accordingly, pattern stains may be visible from the outside. The conductors 171 may reduce the difference in external light reflectance, thereby reducing the possibility of pattern stains being visible from the outside.

The conductors 171 may be located within the second openings OP2 and may be spaced apart from the second touch electrodes 131. In some exemplary embodiments, the conductors 171 may be in a floating state.

In some exemplary embodiments, the conductors 171 may have the same shape as the second openings OP2. For example, when the second openings OP2 have a rhombic shape, the conductor 171 may also have a be rhombic shape.

As illustrated in FIG. 6, the conductors 171 may be made of the first conductive layer L1, like the first touch electrodes 121, the second touch electrodes 131, and the conductive patterns 151.

In some exemplary embodiments, when the second touch electrodes 131 have a mesh structure, the conductors 171 may also have a mesh structure, as illustrated in FIG. 8.

In some exemplary embodiments, the area of each of the first openings OP1 may be smaller than the area of each of the second openings OP2. Accordingly, the area of each of the conductors 171 may be larger than the area of each of the conductive patterns 151.

In some exemplary embodiments, conductors 171 located closest to the peripheral area NSA along the second direction y among the conductors 171 may have a different shape from other conductors 171. For example, each conductor 171 located in the fifth row RO5 and the first row RO1 may have the shape of a portion of each conductor 171 located in the second row RO2, the third row RO3, or the fourth row RO4.

In some exemplary embodiments, the contact electrodes 710, 730, and 750 may be further located on the sensing area SA of the base layer 110.

The contact electrodes 710, 730, and 750 may include first contact electrodes 710, second contact electrodes 730, and third contact electrodes 750.

The first contact electrodes 710 may be arranged along the second direction y and respectively connected to ends of the first touch electrode members 120. For example, the first contact electrodes 710 may be connected ends of the first touch electrodes 121 located in the first electrode column CE1.

The second contact electrodes 730 may be arranged along the first direction x and respectively connected to ends of the second touch electrode members 130. For example, the second contact electrodes 730 may be connected to ends of the second touch electrodes 131 located in the first row RO1.

The third contact electrodes 750 may be arranged along the first direction x, located opposite the second contact electrodes 730, and respectively connected to ends of the second touch electrode members 130. For example, the third contact electrodes 750 may be connected to ends of the second touch electrodes 131 located in the fifth row RO5.

In some exemplary embodiments, the first contact electrodes 710, the second contact electrodes 730, and the third contact electrodes 750 may each include a lower contact electrode made of the second conductive layer L2, and an upper contact electrode made of the first conductive layer L1. The lower contact electrode and the upper contact electrode may be electrically connected to each other.

The specific structure of the contact electrodes 710, 730, and 750 will be described later with reference to FIGS. 24 through 36.

In the touch sensor TSM according to an exemplary embodiment, the first touch electrodes 121, the second touch electrodes 131, the first connection portions 123, the conductive patterns 151, and the conductors 171 are made of the first conductive layer L1, and the second connection portions 133 and the connection lines 153 are made of the second conductive layer L2. Since components made of the same conductive layer can be simultaneously formed in the same process, the manufacturing process can be simplified.

In addition, since each of the conductive members 150 can output the noise signal Ns during the touch sensing operation of the touch sensor TSM, the malfunction of the touch sensor TSM can be minimized, and the sensing sensitivity of the touch sensor TSM can be improved.

Figure 12:
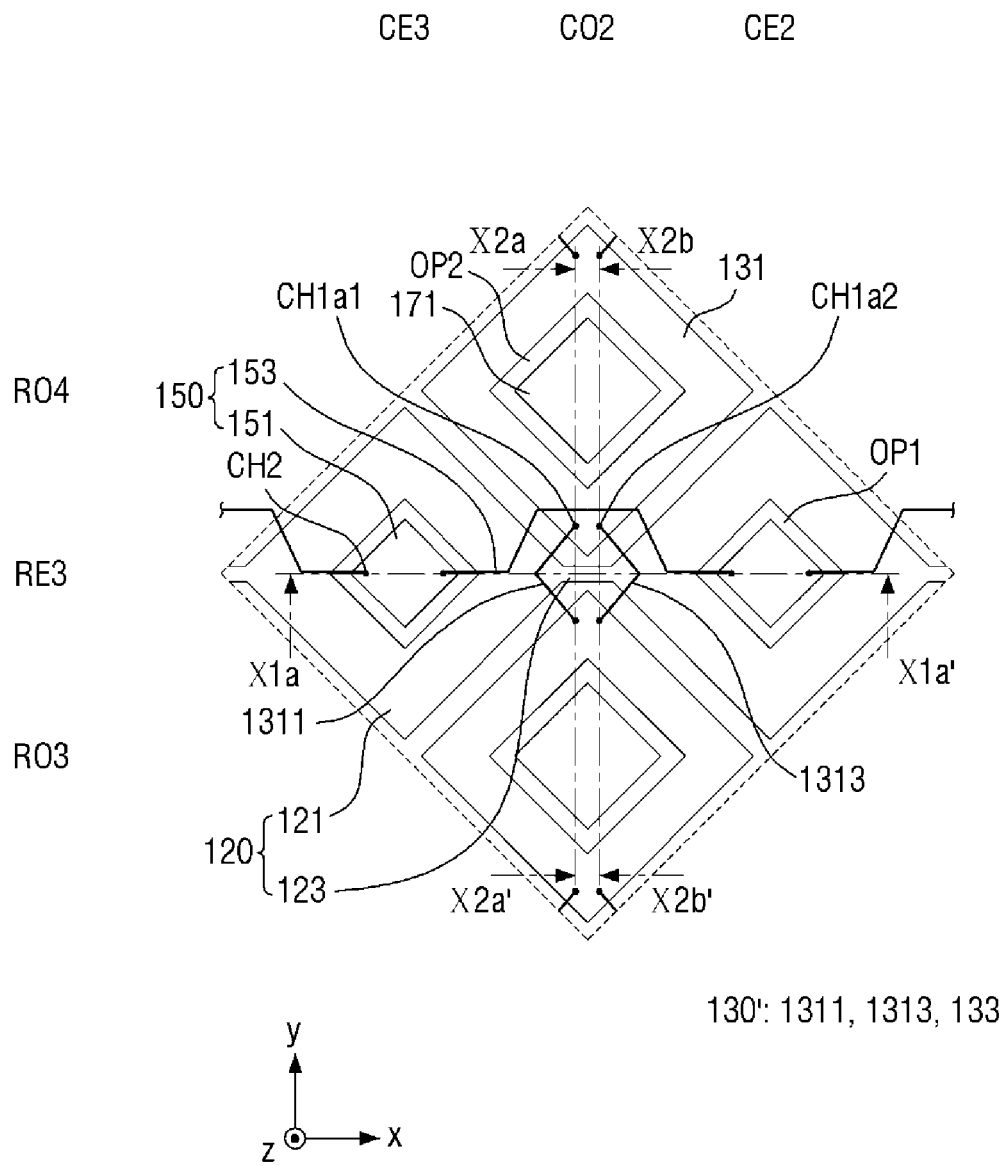
FIG. 12 is an enlarged plan view of portion Qa of FIG. 4 according to another exemplary embodiment.
Figure 13:
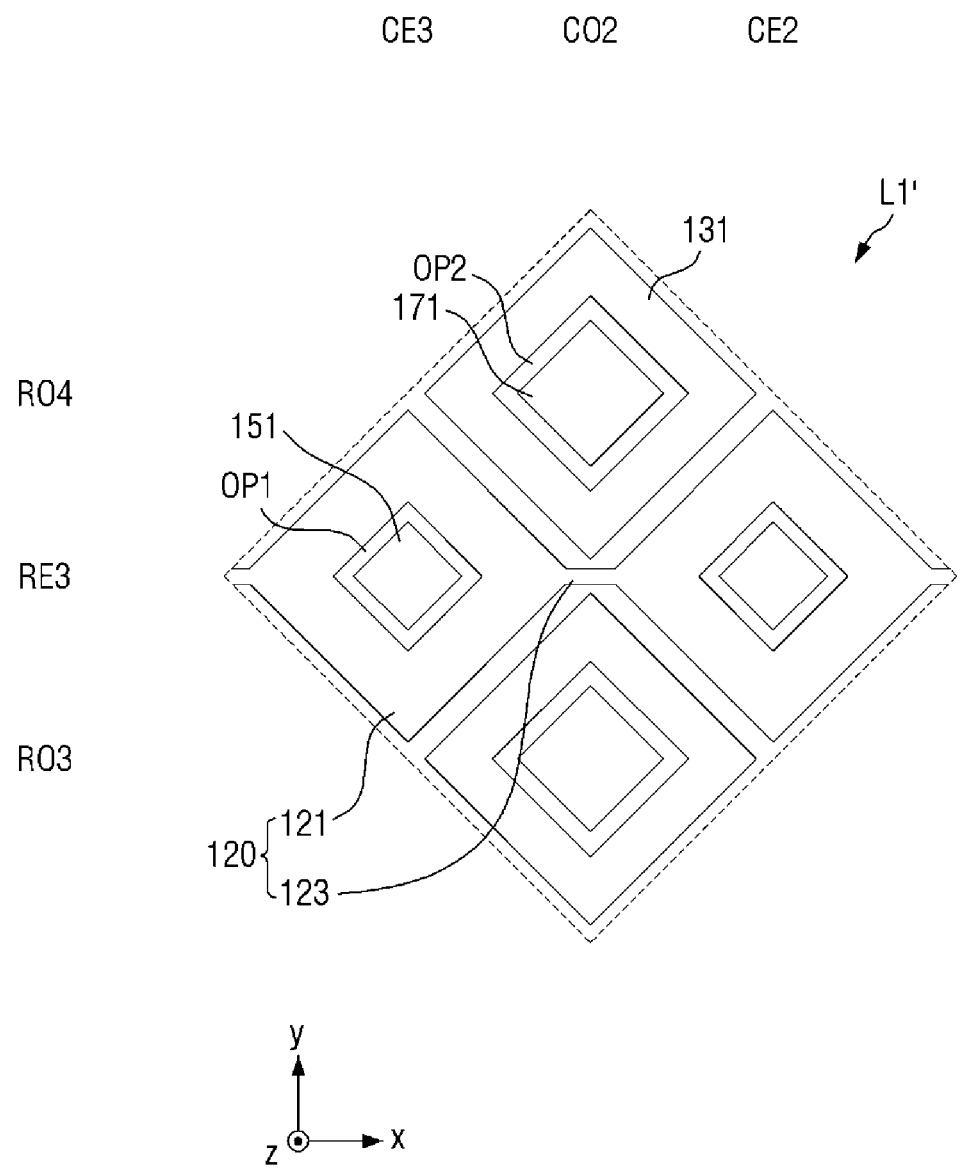
FIG. 13 illustrates components made of a first conductive layer in a sensor unit of FIG. 12.
Figure 14:
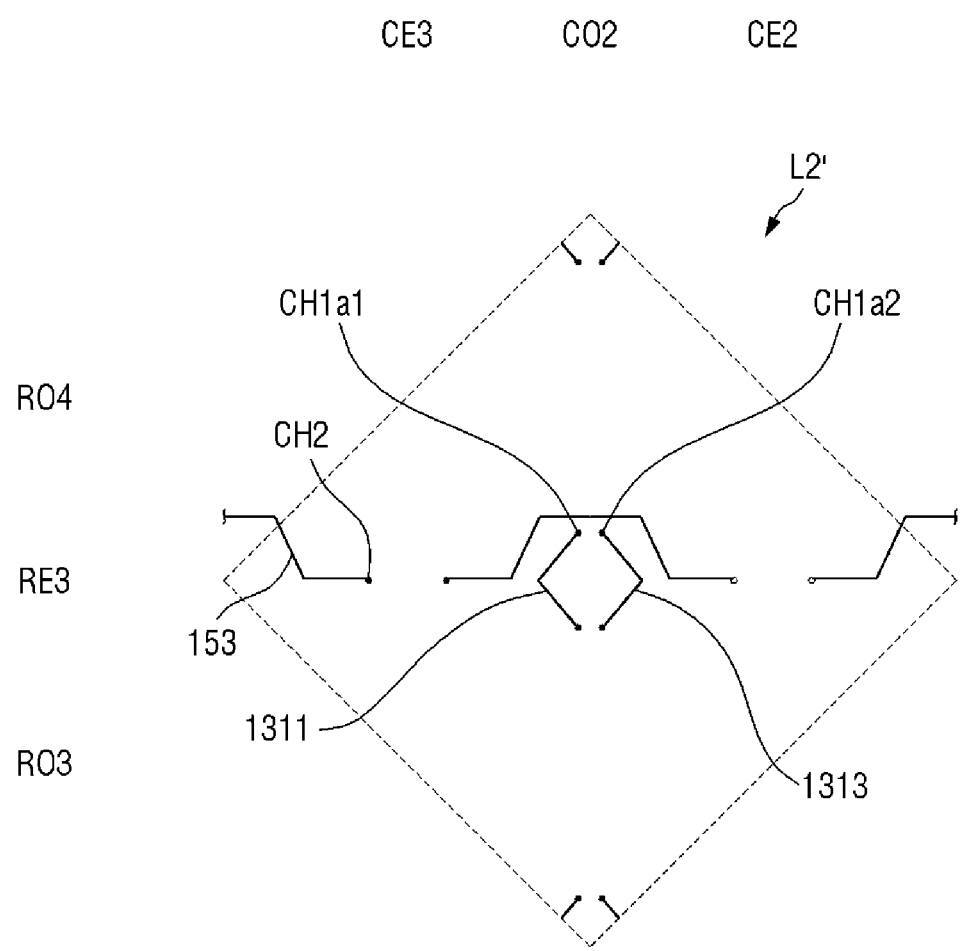
FIG. 14 illustrates components made of a second conductive layer in the sensor unit of FIG. 12.
Figure 15:
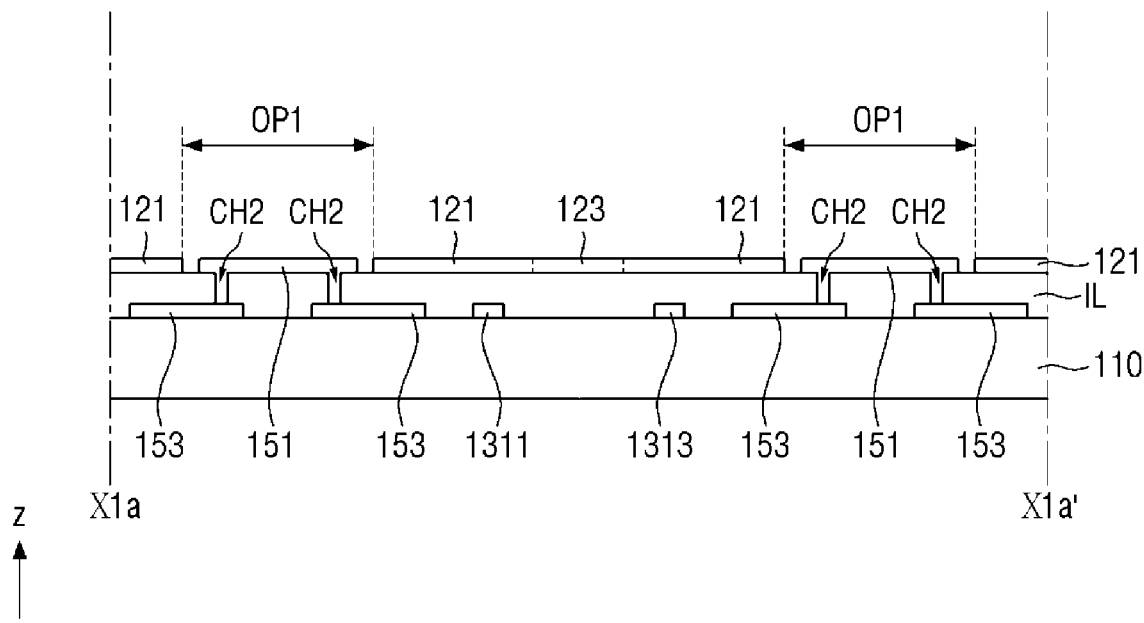
FIG. 15 is a cross-sectional view taken along X1a-X1a' of FIG. 12.
Figure 16:
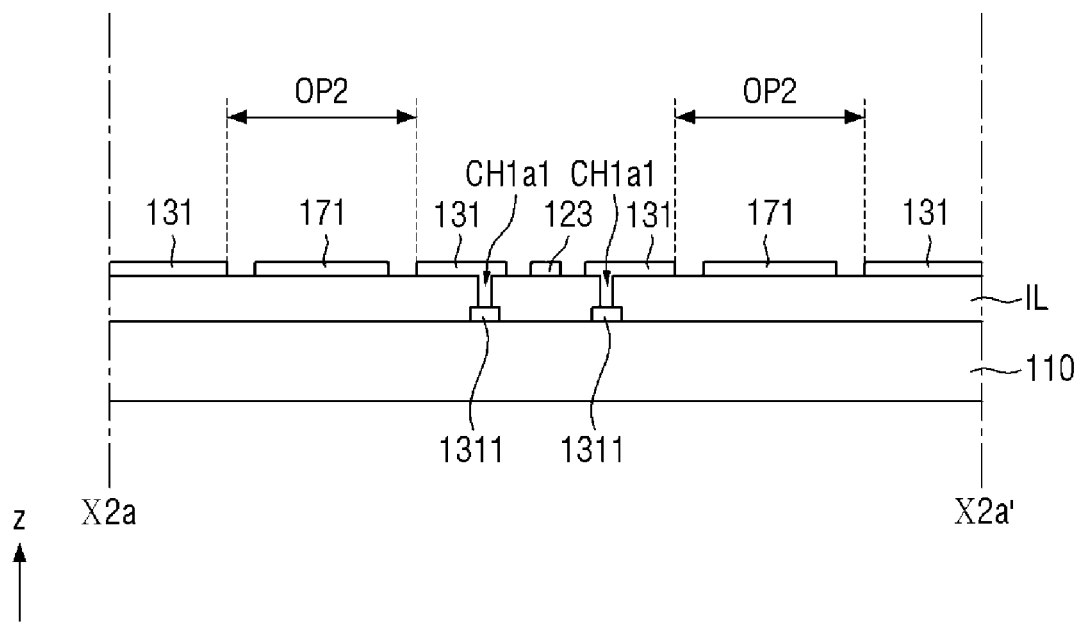
FIG. 16 is a cross-sectional view taken along X2a-X2a' of FIG. 12.
Figure 17:
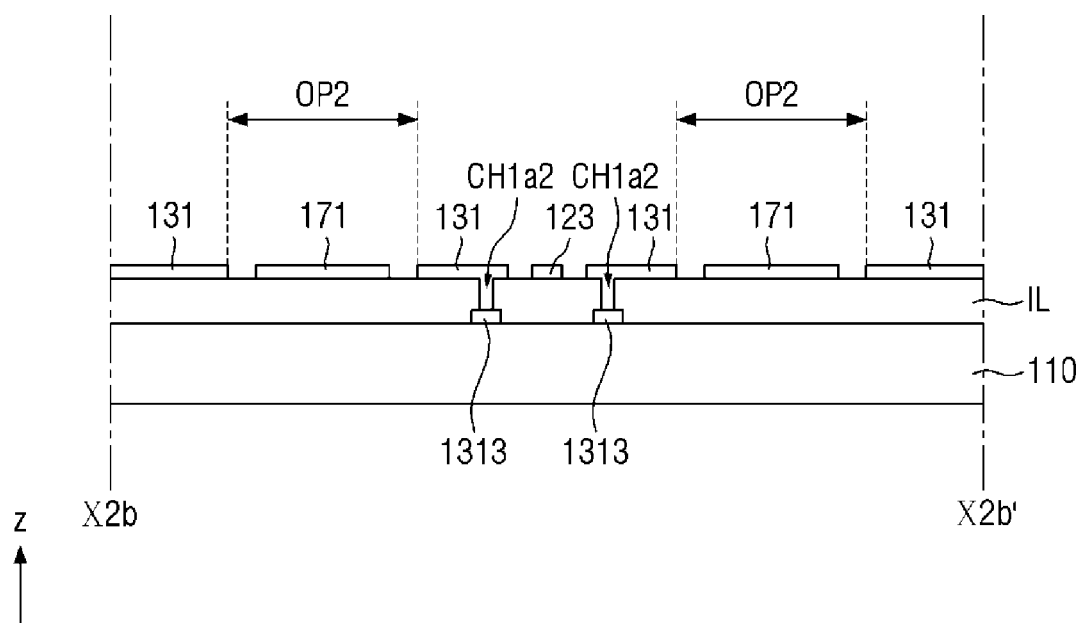
FIG. 17 is a cross-sectional view taken along X2b-X2b' of FIG. 12.

FIG. 12 is an enlarged plan view of portion Qa of FIG. 4 according to another exemplary embodiment. FIG. 13 illustrates components made of a first conductive layer L1' in a sensor unit of FIG. 12. FIG. 14 illustrates components made of a second conductive layer L2' in the sensor unit of FIG. 12. FIG. 15 is a cross-sectional view taken along X1a-X1a' of FIG. 12. FIG. 16 is a cross-sectional view taken along X2a-X2a' of FIG. 12. FIG. 17 is a cross-sectional view taken along X2b-X2b' of FIG. 12.

Referring to FIGS. 12 to 17, a second touch electrode member 130' according to an exemplary embodiment may include second touch electrodes 131 and two second connection portions 1311 and 1313. Any one of the two second connection portions 1311 and 1313 will be referred to as a first sub-connection portion 1311, and the other will be referred to as a second sub-connection portion 1313. Each of the first sub-connection portion 1311 and the second sub-connection portion 1313 may electrically connect the second touch electrodes 131 neighboring each other along the second direction y.

A first connection portion 123 of a first touch electrode member 120 may be made of the first conductive layer L1', like first touch electrodes 121 and the second touch electrodes 131.

The first sub-connection portion 1311 and the second sub-connection portion 1313 may be made of the second conductive layer L2', like a connection line 153.

The first sub-connection portion 1311 and the second touch electrodes 131 may be connected to each other through contact holes CH1a1 formed in an insulating layer IL. In addition, the second sub-connection portion 1313 and the second touch electrodes 131 may be connected to each other through contact holes CH1a2 formed in the insulating layer IL.

The second conductive layer L2' may be disposed on a base layer 110, the insulating layer IL may be disposed on the second conductive layer L2', and the first conductive layer L1' may be disposed on the insulating layer IL, as described above with reference to FIG. 3.

In an exemplary embodiment, the second touch electrodes 131 are connected to each other by two or more components. Therefore, even if any one of the first sub-connection portion 1311 and the second sub-connection portion 1313 is broken, the electrical connection between the second touch electrodes 131 can be maintained using the other one of the sub-connection portion to improve connection reliability.

Other components are substantially the same as those described above with reference to FIGS. 4 through 11, and thus, repeated descriptions thereof will be omitted to avoid redundancy.

Figure 18:
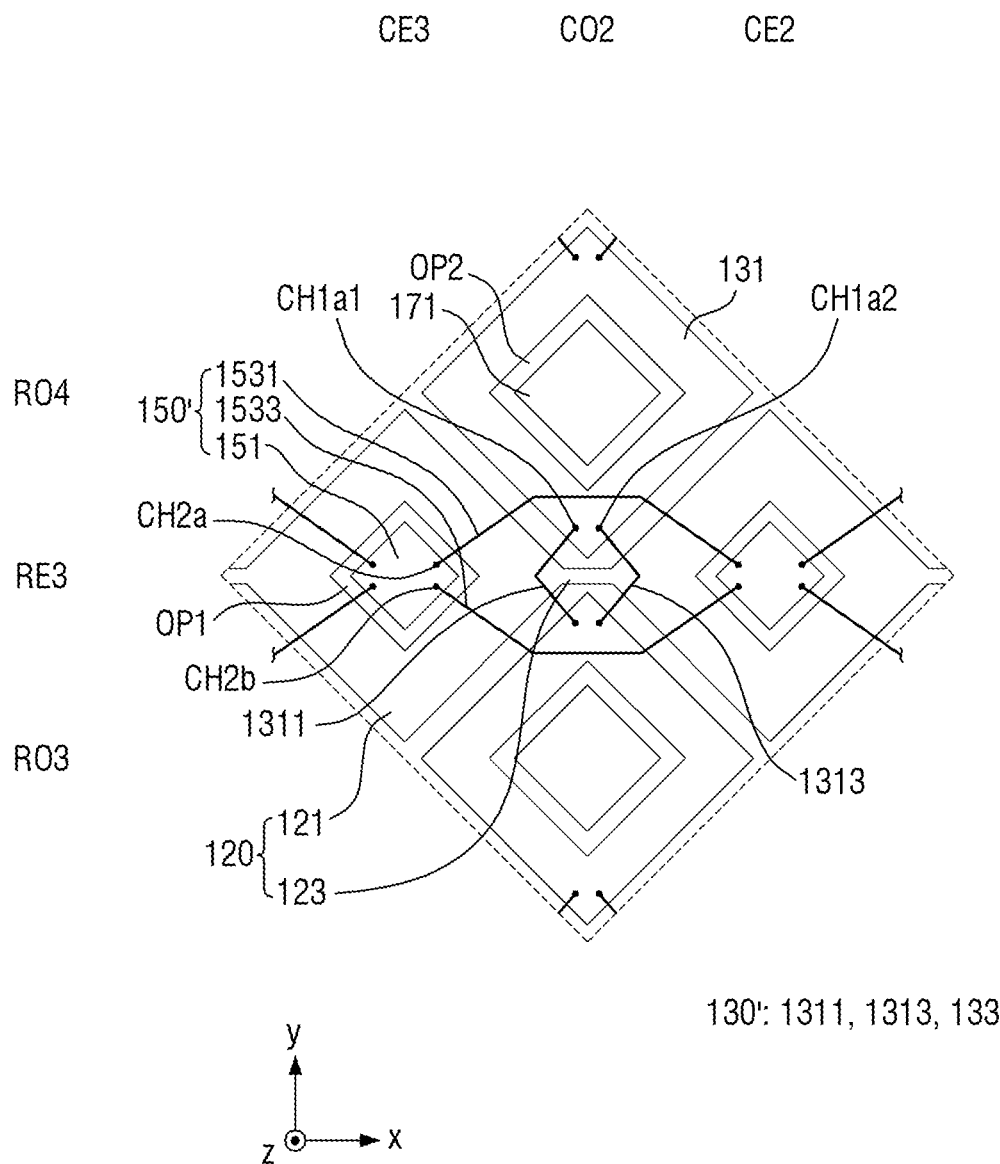
FIG. 18 is an enlarged plan view of portion Qa of FIG. 4 according to yet another exemplary embodiment.
Figure 19:
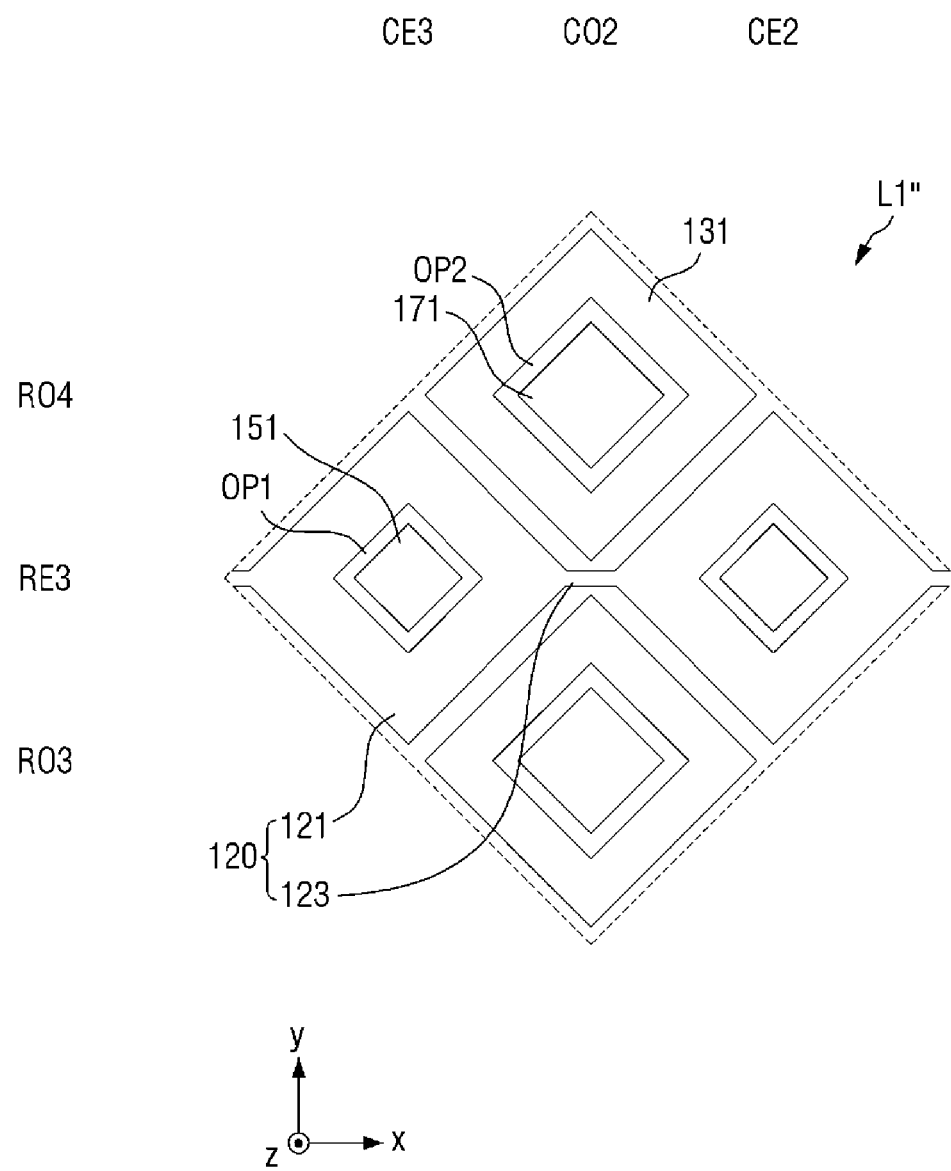
FIG. 19 illustrates components made of a first conductive layer in a sensor unit of FIG. 18.
Figure 20:
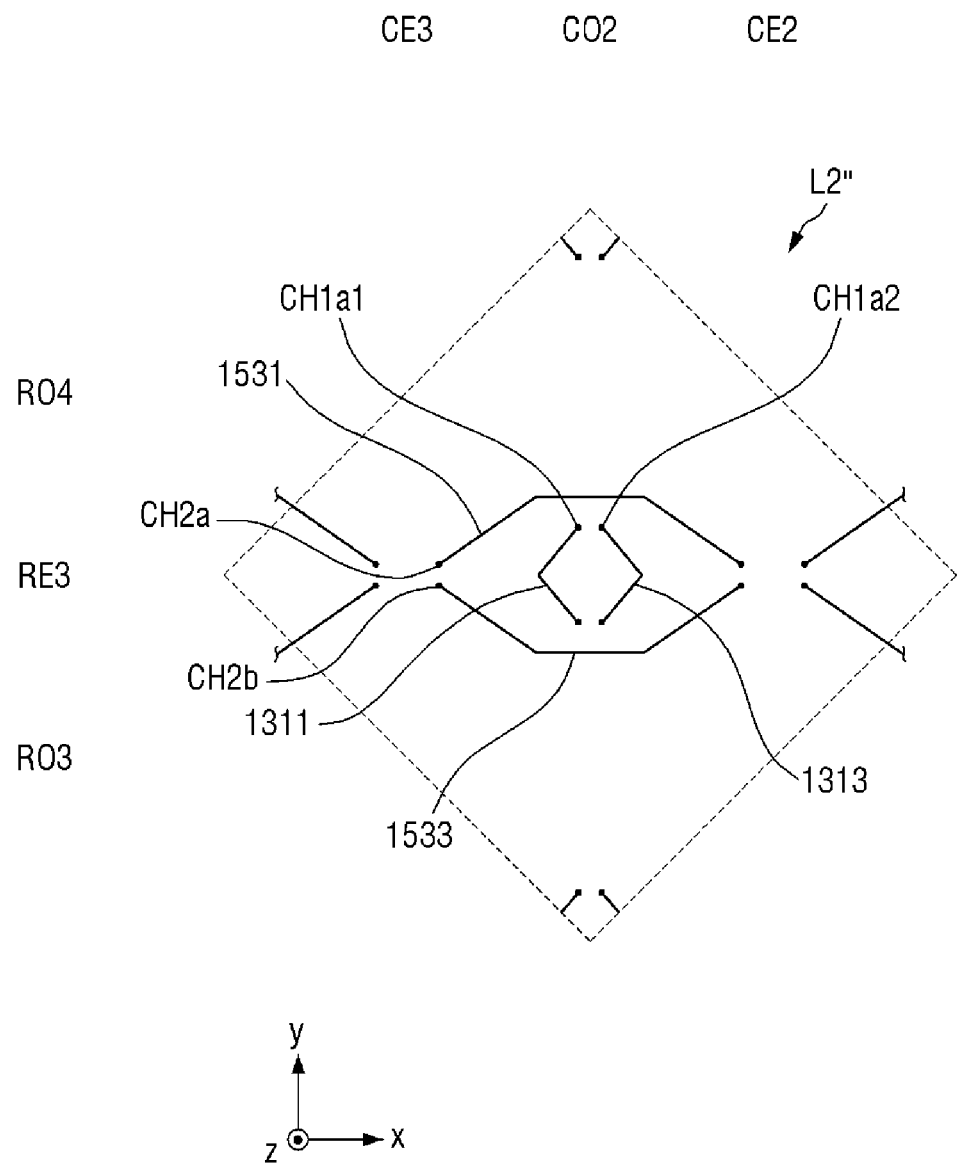
FIG. 20 illustrates components made of a second conductive layer in the sensor unit of FIG. 18.

FIG. 18 is an enlarged plan view of portion Qa of FIG. 4 according to yet another exemplary embodiment. FIG. 19 illustrates components made of a first conductive layer L1" in a sensor unit of FIG. 18. FIG. 20 illustrates components made of a second conductive layer L2" in the sensor unit of FIG. 18.

Referring to FIGS. 18 to 20, a conductive member 150' may include conductive patterns 151 and two connection lines 1531 and 1533. One of the two connection lines 1531 and 1533 will be referred to as a first sub-connection line 1531, and the other will be referred to as a second sub-connection line 1533. Each of the first sub-connection line 1531 and the second sub-connection line 1533 may electrically connect the conductive patterns 151 neighboring each other along the first direction x.

A first connection portion 123 of a first touch electrode member 120 may be made of the first conductive layer L1", like first touch electrodes 121 and second touch electrodes 131.

A first sub-connection portion 1311, a second sub-connection portion 1313, the first sub-connection line 1531, and the second sub-connection line 1533 may all be made of the second conductive layer L2".

The first sub-connection line 1531 and the conductive patterns 151 may be connected to each other through contact holes CH2a formed in an insulating layer IL. In addition, the second sub-connection line 1533 and the conductive patterns 151 may be connected to each other through contact holes CH2b formed in the insulating layer IL.

The second conductive layer L2" may be disposed on a base layer 110, the insulating layer IL may be disposed on the second conductive layer L2", and the first conductive layer L1" may be disposed on the insulating layer IL, as described above with reference to FIG. 3.

Hereinafter, the sensing area SA of the sensor unit 100 will be described as having the structure illustrated in FIGS. 4 through 11, however, the inventive concepts are not limited thereto.

According to an exemplary embodiment, the base layer 110 serving as the base of the sensor unit 100 may be a thin-film encapsulation layer of an organic light emitting display panel. In this case, the base layer 110 may have a multilayer structure including at least one organic layer and at least one inorganic layer, or may have a single layer structure including a combination of organic and inorganic materials. For example, the base layer 110 may be a multilayer including at least two inorganic layers and at least one organic layer interposed between the inorganic layers. When the base layer 110 of a display device is formed as a thin-film encapsulation layer of an organic light emitting display panel, electrodes of the sensor unit 100 and components of the display panel 300 may be formed on different surfaces of the base layer 110.

Figure 21:
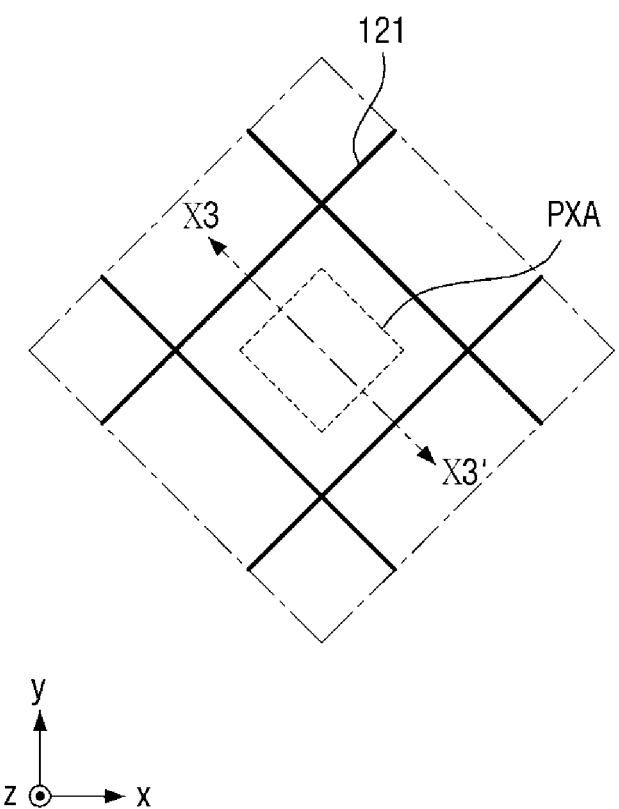
FIG. 21 is an enlarged plan view of portion Q3 of FIG. 6.
Figure 22:
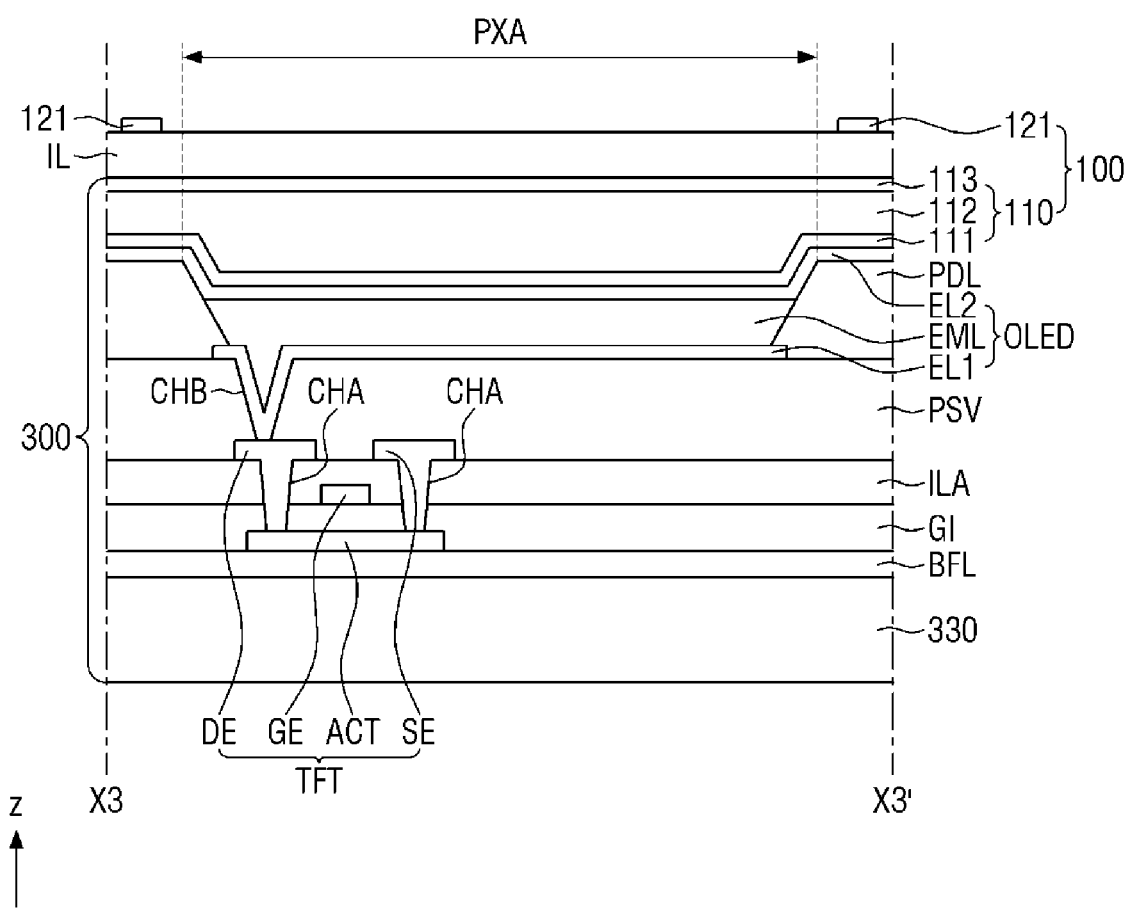
FIG. 22 is a cross-sectional view taken along X3-X3' of FIG. 21.

FIG. 21 is an enlarged plan view of portion Q3 of FIG. 6 according to an exemplary embodiment. FIG. 22 is a cross-sectional view taken along X3-X3' of FIG. 21.

Referring to FIGS. 21 and 22, the sensor unit 100 may include a thin-film encapsulation layer of the display panel 300 (e.g., an organic light emitting display panel) as the base layer 110. More particularly, the display panel 300 and the sensor unit 100 may be formed integrally with each other. Hereinafter, the same reference numeral will be given to the base layer 110 and the thin-film encapsulation layer. FIG. 22 illustrates only a light emitting element OLED (e.g., an organic light emitting diode) and one thin-film transistor TFT connected to the light emitting element OLED, among components provided in each pixel of the display panel 300, for convenience of description.

The display panel 300 includes a base substrate 330. The light emitting element OLED is provided on a surface of the base substrate 330, and the thin-film encapsulation layer 110 is provided on the light emitting element OLED and covers at least the light emitting element OLED. In addition, the display panel 300 according to an exemplary embodiment may further include at least one thin-film transistor TFT connected to the light emitting element OLED. The thin-film transistor TFT may be disposed between the base substrate 330 and the light emitting element OLED.

The display panel 300 may further include at least one power supply line, a signal line, and/or a capacitor.

According to an exemplary embodiment, the base substrate 330 may be a rigid substrate or a flexible substrate, and the material of the base substrate 330 is not particularly limited. For example, the base substrate 330 may be a thin-film substrate having flexible characteristics.

A buffer layer BFL is provided on the surface of the base substrate 330. The buffer layer BFL may prevent the diffusion of impurities from the base substrate 330, and improve the adhesion between the base substrate 330 and other components. The buffer layer BFL may be provided as a single layer, but may also be provided as a multilayer including of at least two layers. The buffer layer BFL may be an inorganic insulating layer made of an inorganic material. For example, the buffer layer BFL may be made of silicon nitride, silicon oxide, or silicon oxynitride.

The thin-film transistor TFT is provided on the buffer layer BFL. The thin-film transistor TFT includes an active layer ACT, a gate electrode GE, a source electrode SE, and a drain electrode DE. According to an exemplary embodiment, the active layer ACT may be provided on the buffer layer BFL and may be made of a semiconductor material. For example, the active layer ACT may be a semiconductor pattern made of polysilicon, amorphous silicon, or an oxide semiconductor. A region (e.g., a region overlapping the gate electrode GE) of the active layer ACT may not be doped with an impurity, and the other region may be doped with an impurity.

A gate insulating layer GI may be provided on the active layer ACT, and the gate electrode GE may be provided on the gate insulating layer GI. In addition, an interlayer insulating film ILA may be provided on the gate electrode GE, and the source electrode SE and the drain electrode DE may be provided on the interlayer insulating film ILA. The source electrode SE and the drain electrode DE may contact and be electrically connected to the active layer ACT, respectively, through contact holes CHA penetrating the gate insulating layer GI and the interlayer insulating film ILA.

According to an exemplary embodiment, a passivation layer PSV is provided on the source electrode SE and the drain electrode DE. The passivation layer PSV may cover the thin-film transistor TFT.

The light emitting element OLED is provided on the passivation layer PSV. The light emitting element OLED may include a first electrode EL1, a second electrode EL2, and a light emitting layer EML interposed between the first electrode EL1 and the second electrode EL2. According to an exemplary embodiment, the first electrode EL1 of the light emitting element OLED may be an anode. The first electrode EL1 of the light emitting element OLED may contact and be electrically connected to an electrode (e.g., the drain electrode DE) of the thin-film transistor TFT through a contact hole CHB penetrating the passivation layer PSV.

A pixel defining layer PDL for defining a light emitting area PXA of each pixel is provided on the surface of the base substrate 330, on which the first electrode EL1 of the light emitting element OLED, etc. are formed. The pixel defining layer PDL may expose an upper surface of the first electrode EL1 and protrude from the base substrate 330 along the periphery of each pixel area.

The light emitting layer EML is provided in the light emitting area PXA surrounded by the pixel defining layer PDL. For example, the light emitting layer EML may be disposed on the exposed surface of the first electrode EL1. According to an exemplary embodiment, the light emitting layer EML may have a multilayer thin-film structure including at least a light generation layer. For example, the light emitting layer EML may include a hole injection layer, a hole transport layer, a light generation layer, a hole blocking layer (HBL), an electron transport layer (ETL), and an electron injection layer (EIL). According to an exemplary embodiment, the color of light generated by the light emitting layer EML may be one of red, green, and blue. Alternatively, the color of light generated by the light emitting layer EML may be one of magenta, cyan, and yellow.

The second electrode EL2 of the light emitting element OLED may be disposed on the light emitting layer EML. The second electrode EL2 of the light emitting element OLED may be a cathode.

The thin-film encapsulation layer 110 may be provided on the second electrode EL2 of the light emitting element OLED to cover the second electrode EL2 of the light emitting element OLED. The thin-film encapsulation layer 110 may seal the light emitting element OLED. The thin-film encapsulation layer 110 includes at least one inorganic layer (hereinafter, referred to as an encapsulating inorganic layer). The thin-film encapsulation layer 110 may further include at least one organic layer (hereinafter, referred to as an encapsulating organic layer). The encapsulating inorganic layer protects the light emitting element OLED from moisture/oxygen, and the encapsulating organic layer protects the light emitting element OLED from foreign matter, such as dust particles. When the light emitting element OLED is sealed using the thin-film encapsulation layer 110, the thickness of the display device 1 can be reduced, and flexible characteristics can be secured.

The thin-film encapsulation layer 110 may have a multi-layer structure or a single-layer structure. For example, the thin-film encapsulation layer 110 may include a first encapsulating inorganic layer 111, an encapsulating organic layer 112, and a second encapsulating inorganic layer 113 sequentially stacked on the second electrode EL2.

In some exemplary embodiments, each of the first encapsulating inorganic layer 111 and the second encapsulating inorganic layer 113 may include at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), and lithium fluoride.

In some exemplary embodiments, the encapsulating organic layer 112 may include at least one of acrylic resin, methacrylic resin, polyisoprene, vinyl resin, epoxy resin, urethane resin, cellulose resin, and perylene resin.

The structure of the thin-film encapsulation layer 110 is not limited to the above example, and the stacked structure of the thin-film encapsulation layer 110 can be variously changed.

The components of the second conductive layer L2 of the touch sensor TSM described above may be disposed on the thin-film encapsulation layer 110. The insulating layer IL may be disposed on the second conductive layer L2, and the first conductive layer L1 of the touch sensor TSM may be disposed on the insulating layer IL. In the drawings, the first touch electrodes 121 are illustrated as components of the first conductive layer L1. The first touch electrodes 121 may have a mesh structure, so as not to be visible to a user as described above, and may be disposed to not overlap the light emitting areas PXA. In particular, mesh holes, each overlapping a light emitting area PXA, may be defined in each of the first touch electrodes 121 having the mesh structure.

In the display device 1 according to an exemplary embodiment, the display panel 300 may be formed as an organic light emitting display panel having the thin-film encapsulation layer 110, and the components of the sensor unit 100 may be disposed on the thin-film encapsulation layer 110.

Referring back to FIG. 4, in some exemplary embodiments, the wirings 901, 903, 905, 907, and 909 may be disposed on the peripheral area NSA of the base layer 110 as illustrated in FIG. 4.

For example, the wirings 901, 903, 905, 907 and 909 may include a third touch signal wiring 905 electrically connected to each of the first touch electrode members 120, a first touch signal wiring 901 electrically connected to an end of each of the second touch electrode members 130, a second touch signal wiring 903 connected to the other end of each of the second touch electrode members 130, the noise signal wiring 907 connected to each of the conductive members 150, and the conductive member connecting wiring 909 connected to the other end of each of the conductive members 150. As used herein, the other end of each of the second touch electrode members 130 refers to an end opposite to an end of each second touch electrode member 130 to which the first touch signal wiring 901 is connected. More particularly, a wiring connected to each of the second touch electrode members 130 may have a double routing structure, which can improve a resistive-capacitive (RC) delay caused by the resistance of the second touch electrode member 130. However, the inventive concepts are not limited thereto. For example, any one of the first touch signal wiring 901 and the second touch signal wiring 903 may be omitted, and a wiring connected to each of the second touch electrode members 130 may have a single routing structure in some exemplary embodiments.

In some exemplary embodiments, each of the first touch signal wiring 901 and the second touch signal wiring 903 may be provided in plural, and the first touch signal wirings 901 and the second touch signal wirings 903 may be connected to the second touch electrode members 130, respectively. In addition, the third touch signal wiring 905 may be provided in plural, and the third touch signal wirings 905 may be connected to the first touch electrode members 120, respectively.

In some exemplary embodiments, the first touch signal wirings 901 may be directly connected to the second contact electrodes 730. Since the second contact electrodes 730 are connected to ends of the second touch electrode members 130, a touch signal (e.g., a driving signal) provided from the touch controller 200 to the first touch signal wirings 901 may be transmitted to the second touch electrode members 130 via the second contact electrodes 730.

In some exemplary embodiments, the second touch signal wirings 903 may be directly connected to the third contact electrodes 750. Since the third contact electrodes 750 are connected to the other ends of the second touch electrode members 130, a touch signal (e.g., a driving signal) provided from the touch controller 200 to the second touch signal wirings 903 may be transmitted to the second touch electrode members 130 via the third contact electrodes 750.

In some exemplary embodiments, the third touch signal wirings 905 may be directly connected to the first contact electrodes 710. Since the first contact electrodes 710 are connected to ends of the first touch electrode members 120, touch signals (e.g., sensing signals) generated by the first touch electrode members 120 may be transmitted to the touch controller 200 via the first contact electrodes 710 and the third touch signal wirings 905.

In some exemplary embodiments, only one noise signal wiring 907 and only one conductive member connecting wiring 909 may be provided, unlike the first touch signal wirings 901, the second touch signal wirings 903, and the third touch signal wirings 905. In addition, the noise signal wiring 907 and the conductive member connecting wiring 909 may be connected to all of the conductive members 150. Accordingly, the number of channels or pads allocated to the conductive members 150 can be reduced, and the area occupied by each of the noise signal wiring 907 and the conductive member connecting wiring 909 in the peripheral area NSA can be reduced.

In some exemplary embodiments, the noise signal wiring 907 may be connected to the first connection patterns 810. The first connection patterns 810 respectively located in electrode rows, for example, in the first electrode row RE1, the second electrode row RE2, the third electrode row RE3, and the fourth electrode row RE4 may all be connected to the noise signal wiring 907. In particular, the conductive members 150 respectively located in the electrode rows may all be electrically connected by the first connection patterns 810 and the noise signal wiring 907. Noise signals output from the conductive members 150 may be transmitted to the touch controller 200 via the first connection patterns 810 and the noise signal wiring 907.

In some exemplary embodiments, the noise signal wiring 907 may be located between the second touch signal wirings 903 and the sensing area SA. In particular, the noise signal wiring 907 may be located inside the area surrounded by the second touch signal wirings 903.

In some exemplary embodiments, the conductive member connecting wiring 909 may be connected to the second connection patterns 830. The second connection patterns 830 respectively located in electrode rows, for example, the first electrode row RE1, the second electrode row RE2, the third electrode row RE3, and the fourth electrode row RE4 may all be connected to the conductive member connecting wiring 909.

In some exemplary embodiments, the conductive member connecting wiring 909 may be located between the third touch signal wirings 905 and the sensing area SA. In particular, the conductive member connecting wiring 909 may be located inside the area surrounded by the third touch signal wirings 905.

Ends of the conductive members 150 respectively located in the electrode rows may all be electrically connected by the first connection patterns 810 and the noise signal wiring 907, and the other ends of the conductive members 150 respectively located in the electrode rows may all be electrically connected by the second connection patterns 830 and the conductive member connecting wiring 909. In this manner, the RC delay of noise signals caused by the resistance of the conductive members 150 may be improved.

Pad portions TP1 and TP2 may be located on the peripheral area NSA of the base layer 110. The pad portions TP1 and TP2 may be electrically connected to the first touch signal wirings 901, the second touch signal wirings 903, the third touch signal wirings 905, and the noise signal wiring 907, and the touch controller 200 may be electrically connected to the pad portions TP1 and TP2. Unlike the first touch signal wirings 901, the second touch signal wirings 903, the third touch signal wirings 905, and the noise signal wiring 907, the conductive member connecting wiring 909 may not be connected to the pad portions TP1 and TP2.

In some exemplary embodiments, the pad portions TP1 and TP2 may include a first pad portion TP1 and a second pad portion TP2 spaced apart from each other along the first direction x. The first pad portion TP1 may be connected to the first touch signal wirings 901, the second touch signal wirings 903, and the noise signal wiring 907, and the second pad portion TP2 may be connected to the third touch signal wirings 905. However, the inventive concepts are not limited thereto. For example, the first pad portion TP1 and the second pad portion TP2 may be formed as a single pad portion without being spaced apart from each other. In addition, wirings connected to each of the first pad portion TP1 and the second pad portion TP2 can be variously changed.

Guard wirings G1 through G5 may be further located on the peripheral area NSA of the base layer 110.

The guard wirings G1 through G5 may include a first guard wiring G1, a second guard wiring G2, a third guard wiring G3, a fourth guard wiring G4, and a fifth guard wiring G5.

The first guard wiring G1, the second guard wiring G2, and the fourth guard wiring G4 may be disposed outside the wirings 901, 903, 905, 907, and 909. The first guard wiring G1 may cover the outside of the second touch signal wirings 903 located on its right side of in FIG. 4. The second guard wiring G2 may cover the outside of the third touch signal wirings 905 located on its left side in FIG. 4. The fourth guard wiring G4 may cover the outside of the first touch signal wirings 901 located on a lower side of FIG. 4.

The fifth guard wiring G5 may be disposed inside the area surrounded by the third touch signal wirings 905 to partially cover the third touch signal wirings 905.

The first guard wiring G1, the second guard wiring G2, the fourth guard wiring G4, and the fifth guard wiring G5 may block static electricity or external nose that can be introduced from the outside of the sensor unit 100.

In some exemplary embodiments, the first guard wiring G1 and the fourth guard wiring G4 may be connected to the first pad portion TP1, the second guard wiring G2 and the fifth guard wiring G5 may be connected to the second pad portion TP2, and a reference voltage (e.g., a ground voltage) may be provided to the first guard wiring G1, the second guard wiring G2, the fourth guard wiring G4, and the fifth guard wiring G5.

The third guard wiring G3 may be located between neighboring wirings. The third guard wiring G3 may be located between the second touch signal wirings 903 and the noise signal wiring 907 to block the electrical interference between the second touch signal wirings 903 and the noise signal wiring 907. In some exemplary embodiments, the third guard wiring G3 may be connected to the first pad portion TP1 and receive the reference voltage (e.g., the ground voltage) from the first pad portion TP1.

The peripheral area NSA and the sensing area SA adjacent to the peripheral area NSA will now be described in more detail with reference to FIGS. 23 through 29.

Figure 23:
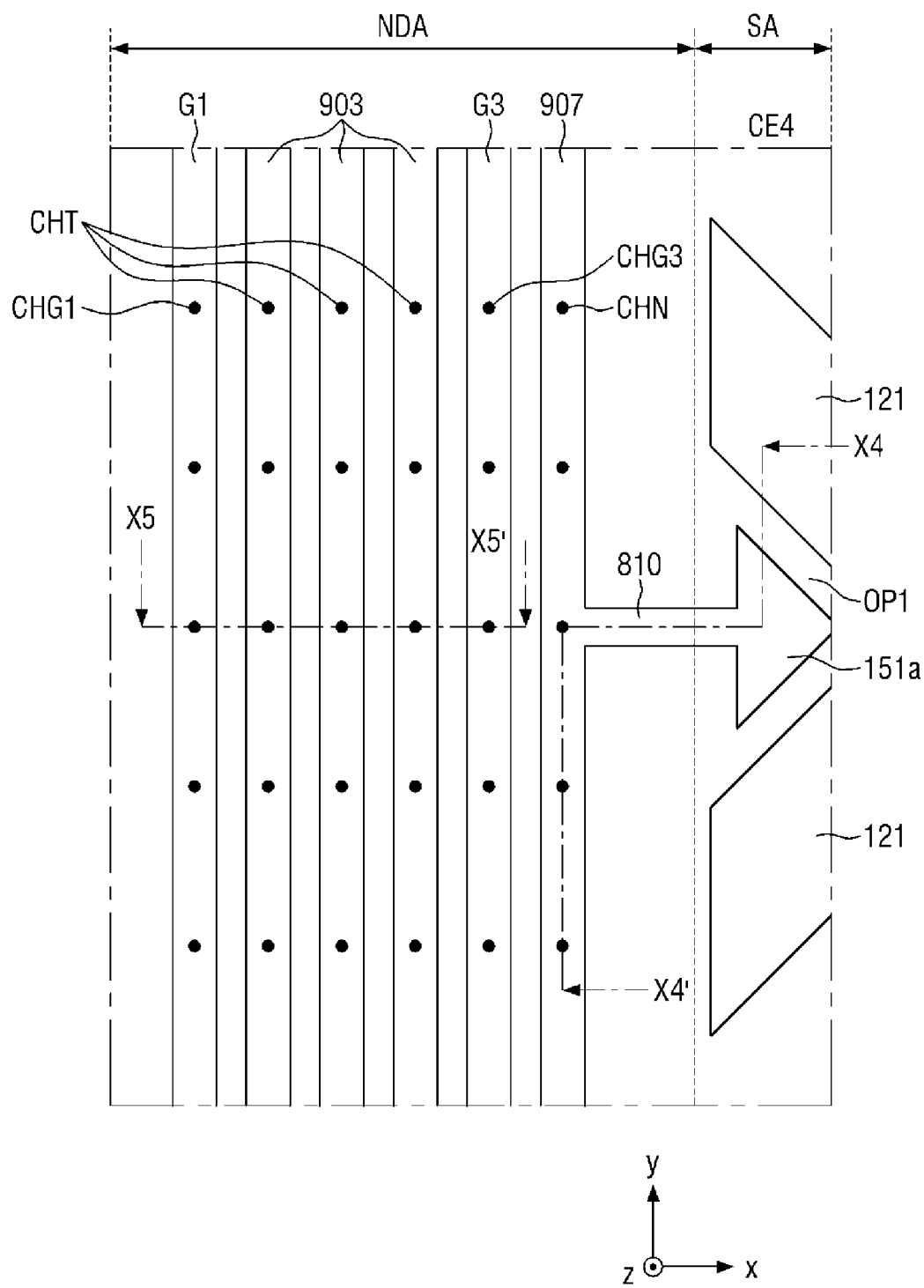
FIG. 23 is an enlarged plan view of portion Qb of FIG. 4 according to an exemplary embodiment.
Figure 24:
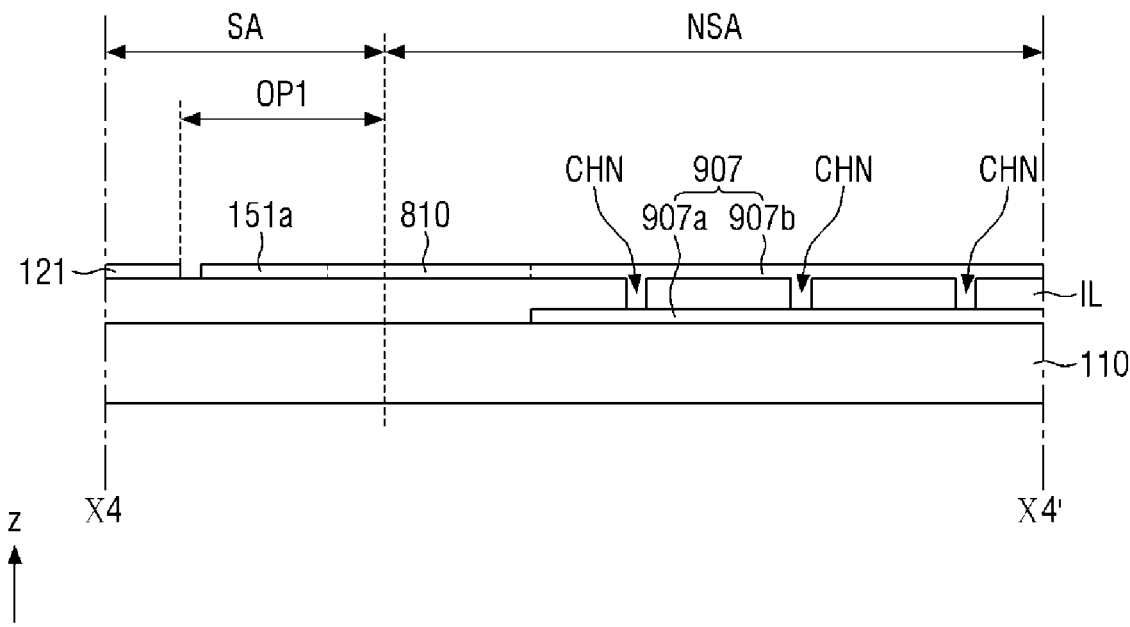
FIG. 24 is a cross-sectional view taken along X4-X4' of FIG. 23 according to an exemplary embodiment.
Figure 25:
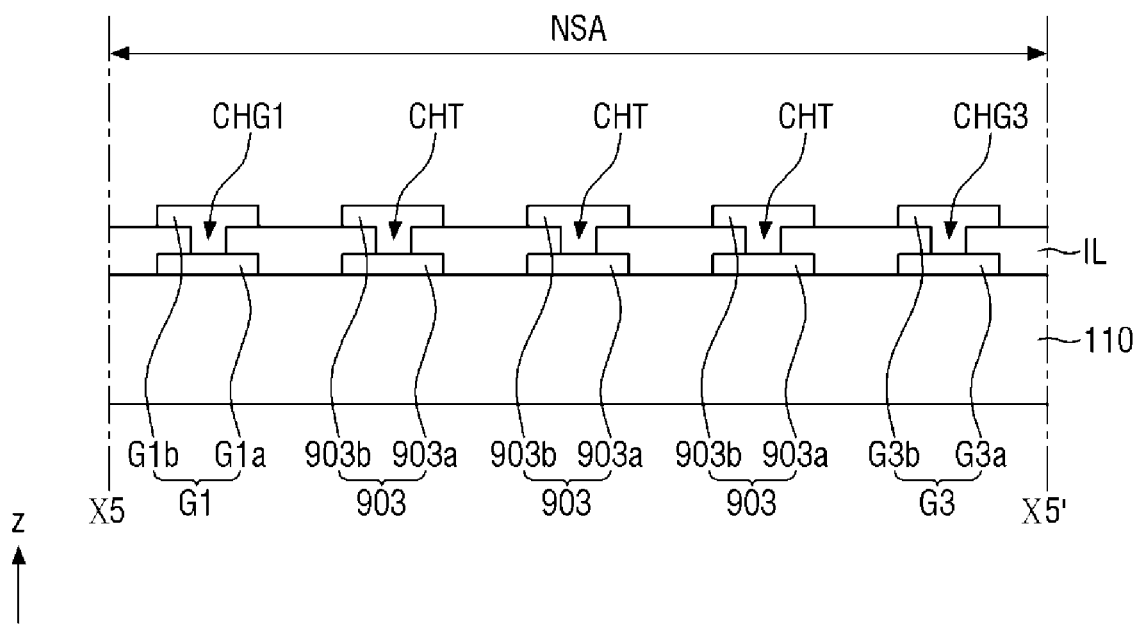
FIG. 25 is a cross-sectional view taken along X5-X5' of FIG. 23 according to an exemplary embodiment.

FIG. 23 is an enlarged plan view of portion Qb of FIG. 4 according to an exemplary embodiment. FIG. 24 is a cross-sectional view taken along X4-X4' of FIG. 23. FIG. 25 is a cross-sectional view taken along X5-X5' of FIG. 23.

Referring to FIGS. 23 through 25, the first guard wiring G1, the second touch signal wirings 903, the third guard wiring G3, and the noise signal wiring 907 may all have a double-layer structure in the peripheral area NSA. Accordingly, wiring resistance can be reduced.

For example, as illustrated in FIG. 25, the first guard wiring G1 may include a first lower guard wiring G1a and a first upper guard wiring G1b. The first lower guard wiring G1a and the first upper guard wiring G1b may be connected to each other through a contact hole CHG1 formed in the insulating layer IL. In some exemplary embodiments, the contact hole CHG1 may be provided in plural along a direction in which the first guard wiring G1 extends.

The third guard wiring G3 may include a third lower guard wring G3a and a third upper guard wiring G3b as illustrated in FIG. 25, and the third lower guard wiring G3a and the third upper guard wiring G3b may be connected to each other through a contact hole CHG3 formed in the insulating layer IL. In some exemplary embodiments, the contact hole CHG3 may be provided in plural along a direction in which the third guard wiring G3 extends.

Each of the second touch signal wirings 903 may include a second lower wiring 903a and a second upper wiring 903b as illustrated in FIG. 25. The second lower wiring 903a and the second upper wiring 903b may be connected to each other through a contact hole CHT formed in the insulating layer IL. In some exemplary embodiments, the contact hole CHT may be provided in plural along a direction in which the second touch signal wirings 903 extend.

The noise signal wiring 907 may include a fourth lower wiring 907a and a fourth upper wiring 907b as illustrated in FIG. 24. The fourth lower wiring 907a and the fourth upper wiring 907b may be connected to each other through a contact hole CHN formed in the insulating layer IL. In some exemplary embodiments, the contact hole CHN may be provided in plural along a direction in which the noise signal wiring 907 extends.

In some exemplary embodiments, the first lower guard wiring G1a, the third lower guard wiring G3a, the second lower wiring 903a, and the fourth lower wiring 907a may be made of the same conductive layer (e.g., the second conductive layer L2 of FIG. 3) as the connection lines 153. In addition, the first upper guard wiring G1b, the third upper guard wiring G3b, the second upper wiring 903b, and the fourth upper wiring 907b may be made of the same conductive layer (e.g., the first conductive layer L1 of FIG. 3) as the first touch electrodes 121 and the conductive patterns 151.

A first connection pattern 810 electrically connects a first conductive pattern 151a and the noise signal wiring 907. In some exemplary embodiments, the first connection pattern 810 may be made of the same conductive layer (e.g., the first conductive layer L1 of FIG. 3) as the first conductive pattern 151a. An end of the first connection pattern 810 may be connected to the first conductive pattern 151a, and the other end of the first connection pattern 810 may be connected to the fourth upper wiring 907b of the noise signal wiring 907.

Figure 26:
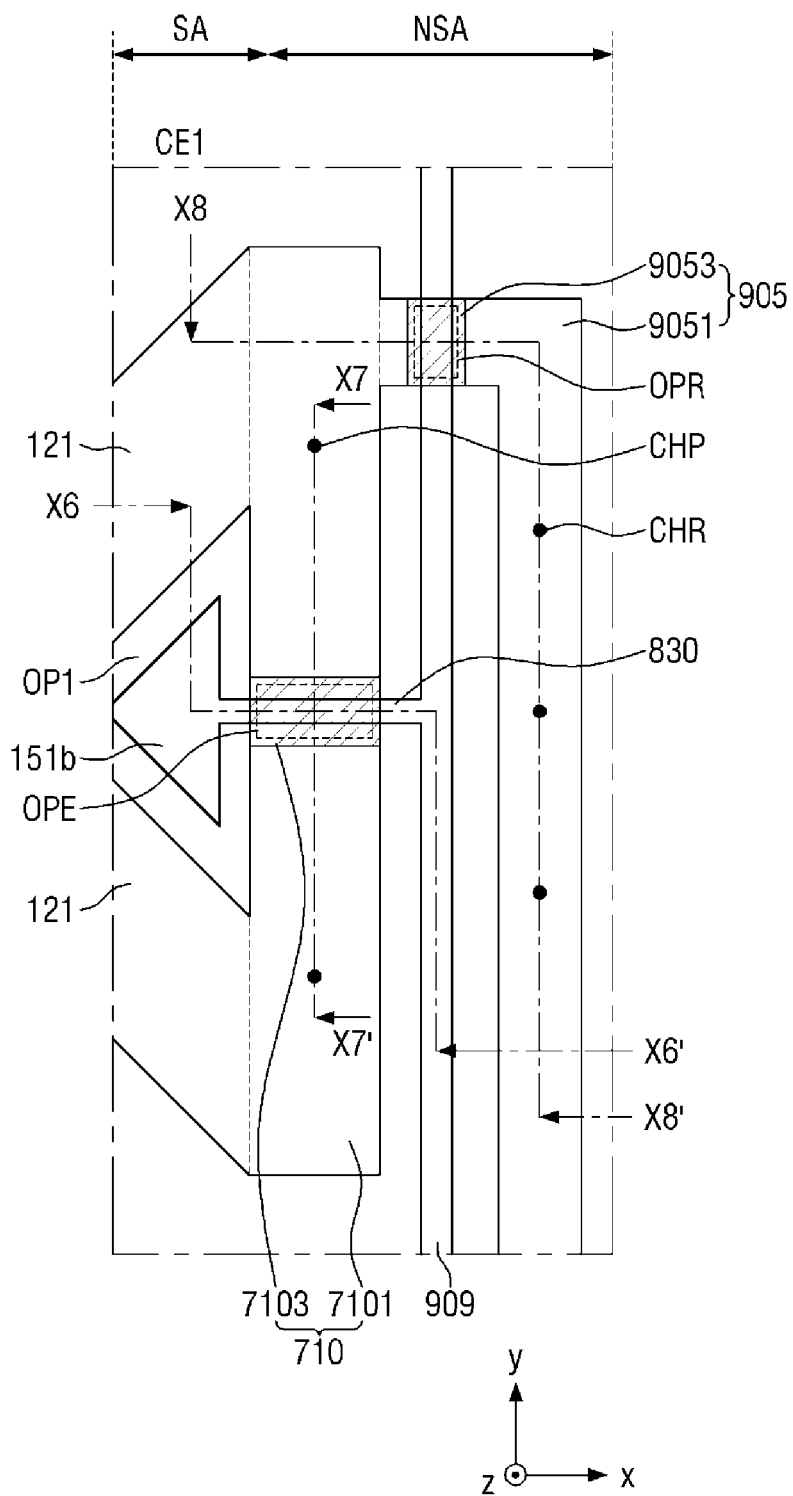
FIG. 26 is an enlarged plan view of portion Qc of FIG. 4 according to an exemplary embodiment.
Figure 27:
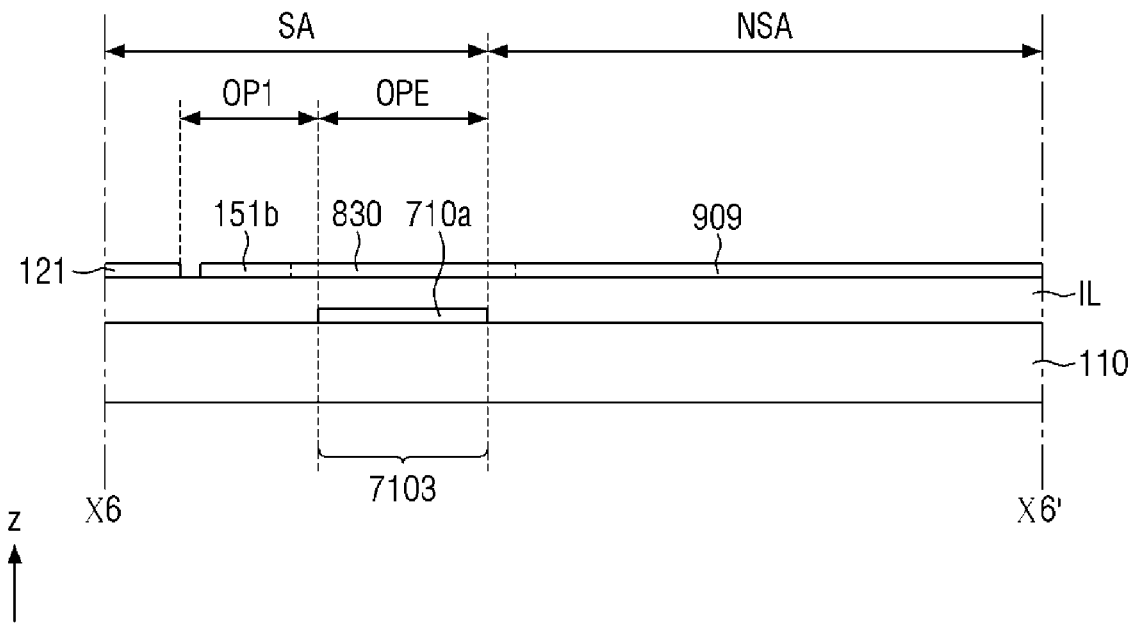
FIG. 27 is a cross-sectional view taken along X6-X6' of FIG. 26 according to an exemplary embodiment.
Figure 28:
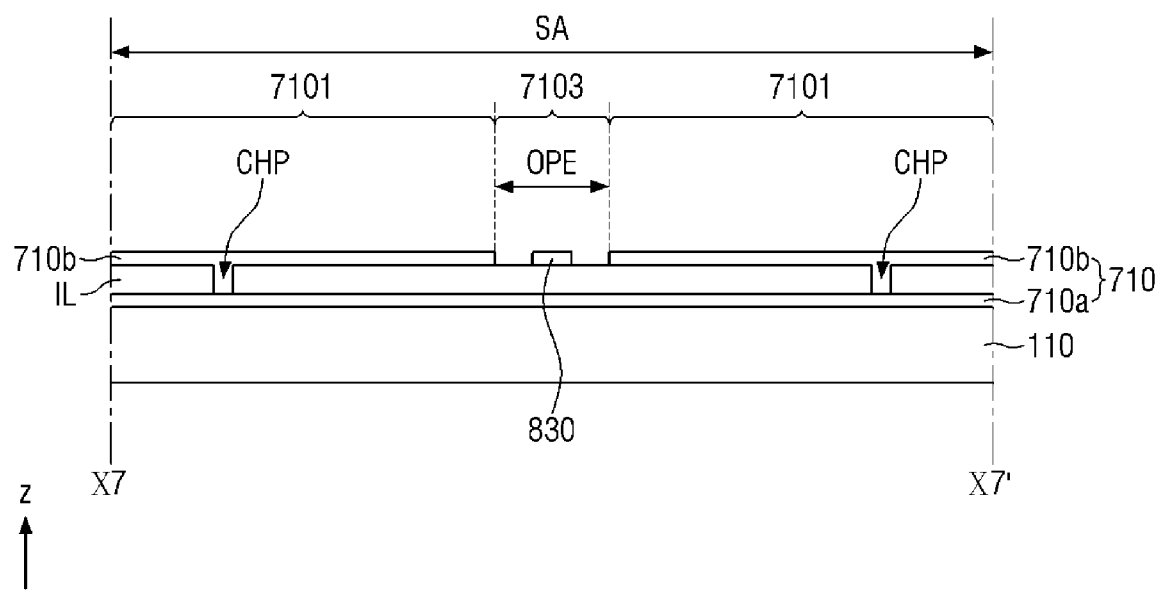
FIG. 28 is a cross-sectional view taken along X7-X7' of FIG. 26 according to an exemplary embodiment.
Figure 29:
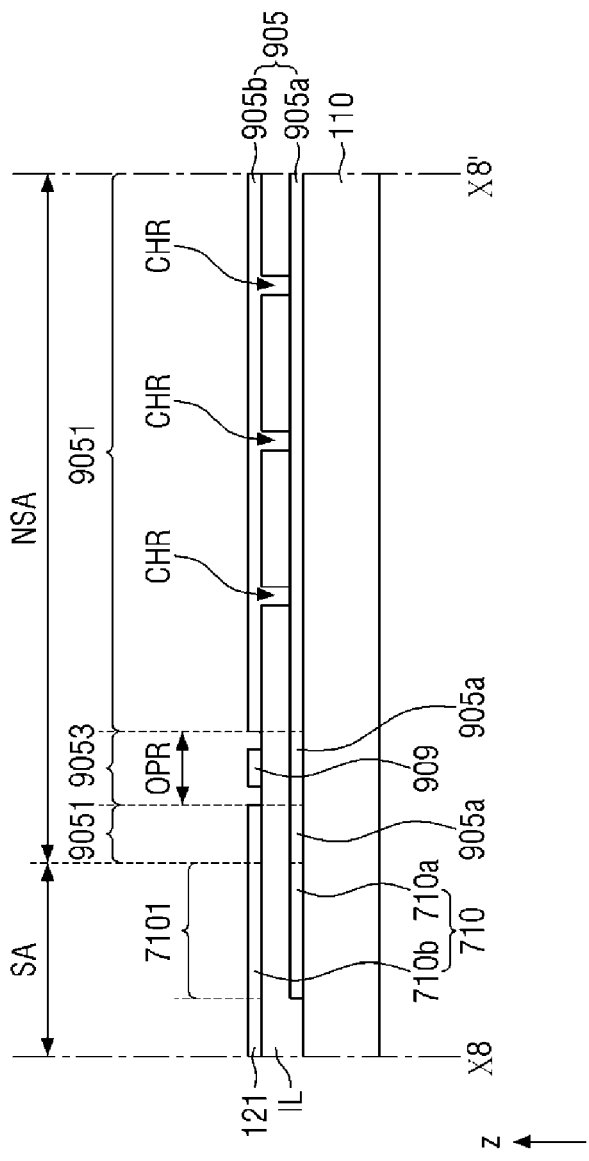
FIG. 29 is a cross-sectional view taken along X8-X8' of FIG. 26 according to an exemplary embodiment.

FIG. 26 is an enlarged plan view of portion Qc of FIG. 4 according to an exemplary embodiment. FIG. 27 is a cross-sectional view taken along X6-X6' of FIG. 26. FIG. 28 is a cross-sectional view taken along X7-X7' of FIG. 26. FIG. 29 is a cross-sectional view taken along X8-X8' of FIG. 26.

Referring to FIGS. 26 through 29, a first contact electrode 710 may be connected to a first touch electrode 121 located in the first electrode column CE1 as described above.

The first contact electrode 710 may include a first lower contact electrode 710a and a first upper contact electrode 710b. In some exemplary embodiments, the first lower contact electrode 710a may be made of the second conductive layer L2 (see FIG. 3), and the first upper contact electrode 710b may be made of the first conductive layer L1 (see FIG. 3). In some exemplary embodiments, the first lower contact electrode 710a and the first upper contact electrode 710b may be connected to each other through contact holes CHP formed in the insulating layer IL.

The first upper contact electrode 710b of the first contact electrode 710 may be connected to an end of the first touch electrode 121. In addition, the first upper contact electrode 710b may be connected to a third upper wiring 905b of a third touch signal wiring 905 which will be described later, and the first lower contact electrode 710a may be connected to a third lower wiring 905a of the third touch signal wiring 905 which will be described later.

In some exemplary embodiments, the first contact electrode 710 may include a first portion 7101 and a second portion 7103. The first portion 7101 may be a portion on which the first lower contact electrode 710a and the first upper contact electrode 710b are disposed in plan view, or may be a portion on which the first lower contact electrode 710a and the first upper contact electrode 710b overlap each other along a third direction z. More particularly, the first portion 7101 may include both the first lower contact electrode 710a and the first upper contact electrode 710b. The second portion 7103 may be a portion on which the first lower contact electrode 710a is disposed without the first upper contact electrode 710b in plan view, or may be a portion formed by removing a portion of the first upper contact electrode 710b. More particularly, an electrode opening OPE may be formed in the second portion 7103 by removing a portion of the first upper contact electrode 710b. In this manner, the second portion 7103 may include the first lower contact electrode 710a and may not include the first upper contact electrode 710b.

In some exemplary embodiments, both sides of the electrode opening OPE may be opened along the first direction x.

The first lower contact electrode 710a included in the first portion 7101 and the first lower contact electrode 710a included in the second portion 7103 may be continuous without being separated from each other. On the other hand, since the first upper contact electrode 710b is not located in the second portion 7103, the first upper contact electrode 710b may be divided into two parts with the second portion 7103 or the electrode opening OPE interposed between the two parts.

The third touch signal wiring 905 may have a double-layer structure in the peripheral area NSA. Accordingly, wiring resistance can be reduced.

For example, as illustrated in FIG. 29, the third touch signal wiring 905 may include the third lower wiring 905a and the third upper wiring 905b. The third lower wiring 905a and the third upper wiring 905b may be connected to each other through a contact hole CHR formed in the insulating layer IL. In some exemplary embodiments, the contact hole CHR may be provided in plural along a direction (e.g., the second direction y) in which the third touch signal wiring 905 extends.

In some exemplary embodiments, the third lower wiring 905a may be made of the same conductive layer (e.g., the second conductive layer L2 of FIG. 3) as the connection lines 153. In addition, the third upper wiring 905b may be made of the same conductive layer (e.g., the first conductive layer L1 of FIG. 3) as the first touch electrodes 121 and the conductive patterns 151.

The third touch signal wiring 905 may include a first portion 9051 and a second portion 9053. The first portion 9051 may be a portion on which the third lower wiring 905a and the third upper wiring 905b are disposed in plan view, or may be a portion on which the third lower wiring 905a and the third upper wiring 905b overlap each other along the third direction z. In particular, the first portion 9051 may include both the third lower wiring 905a and the third upper wiring 905b. The second portion 9053 may be a portion on which only the third lower wiring 905a of the third touch signal wiring 905 is disposed without the third upper wiring 905b in plan view, or may be a portion in which a wiring opening OPR is formed by removing a portion of the third upper wiring 905b. In this manner, the second portion 9053 may include the third lower wiring 905a and may not include the third upper wiring 905b.

In some exemplary embodiments, both sides of the wiring opening OPR may be opened along the second direction y.

The third lower wiring 905a included in the first portion 9051 and the third lower wiring 905a included in the second portion 9053 may be continuous without being separated from each other. On the other hand, since the third upper wiring 905b is not included in the second portion 9053, the third upper wiring 905b may be divided into two parts with the second portion 9053 or the wiring opening OPR interposed between the two parts.

A second connection pattern 830 electrically connects a second conductive pattern 151b and the conductive member connecting wiring 909. In some exemplary embodiments, the second connection pattern 830 may be made of the same conductive layer (e.g., the first conductive layer L1 of FIG. 3) as the second conductive pattern 151b. An end of the second connection pattern 830 may be connected to the second conductive pattern 151b, and the other end of the second connection pattern 830 may be connected to the conductive member connecting wiring 909.

The second connection pattern 830 may overlap the first contact electrode 710. In some exemplary embodiments, the second connection pattern 830 may overlap the second portion 7103 of the first contact electrode 710 and cross the second portion 7103 of the first contact electrode 710 along the first direction x. In particular, at least a portion of the second connection pattern 830 may be located in the electrode opening OPE of the first contact electrode 710, and the second connection pattern 830 may be connected to the conductive member connecting wiring 909 through the electrode opening OPE.

Since the first contact electrode 710 is disposed between the second conductive pattern 151b and the conductive member connecting wiring 909, and includes the first lower contact electrode 710a and the first upper contact electrode 710b, a connection pattern made of a conductive layer different from the first conductive layer L1 and the second conductive layer L2 may be required to connect the second conductive pattern 151b and the conductive member connecting wiring 909. In this case, the number of conductive layers is increased, thereby increasing the number of manufacturing processes. According to the illustrated exemplary embodiment, the electrode opening OPE may be formed by removing a portion of the first upper contact electrode 710b of the first contact electrode 710, and the second connection pattern 830 may be connected to the conductive member connecting wiring 909 through the electrode opening OPE. Therefore, even though the second connection pattern 830 is made of the first conductive layer L1 (see FIG. 3) instead of an additional conductive layer, the second connection pattern 830 and the conductive member connecting wiring 909 can be connected to each other, and the second connection pattern 830 and the first contact electrode 710 can be prevented from being connected to each other. In this manner, the manufacturing process and the product structure can be simplified.

The conductive member connecting wiring 909 may be disposed between the first contact electrode 710 and the third touch signal wiring 905. In some exemplary embodiments, the number of the third touch signal wirings 905 may be greater than the number of the first touch signal wirings 901 or the number of the second touch signal wirings 903. As such, the remaining space in the peripheral area NSA in which the third touch signal wirings 905 are located may be relatively narrow. Accordingly, in some exemplary embodiments, the conductive member connecting wiring 909 may be made of one conductive layer, unlike the third touch signal wirings 905. For example, the conductive member connecting wiring 909 may be made of the first conductive layer L1 (see FIG. 3). Since the conductive member connecting wiring 909 does not include a component made of the second conductive layer L2 (see FIG. 3), a separate process of forming a contact hole in the conductive member connecting wiring 909 may be obviated. Therefore, the area occupied by the conductive member connecting wiring 909 in the peripheral area NSA can be reduced.

The conductive member connecting wiring 909 may overlap the third touch signal wiring 905. In some exemplary embodiments, the conductive member connecting wiring 909 may overlap the second portion 9053 of the third touch signal wiring 905 and cross the second portion 9053 of the third touch signal wiring 905 along the second direction y. In particular, at least a portion of the conductive member connecting wiring 909 may be located in the wiring opening OPR of the third touch signal wiring 905.

Since the conductive member connecting wiring 909 is disposed between the first contact electrode 710 and the third touch signal wiring 905 along the first direction x, a connection pattern made of a conductive layer different from the first conductive layer L1 and the second conductive layer L2 may be required to connect the first contact electrode 710 and the third touch signal wiring 905. In this case, the number of manufacturing processes is increased. According to the illustrated exemplary embodiment, the wiring opening OPR is formed by removing a portion of the third upper wiring 905b of the third touch signal wiring 905, and the conductive member connecting wiring 909 is placed to cross the wiring opening OPR. As such, even if a conductive layer different from the first conductive layer L1 (see FIG. 3) and the second conductive layer L2 (see FIG. 3) is not added, the conductive member connecting wiring 909 and the third touch signal wiring 905 can be prevented from being connected to each other. In this manner, the manufacturing process and the product structure can be simplified.

Figure 30:
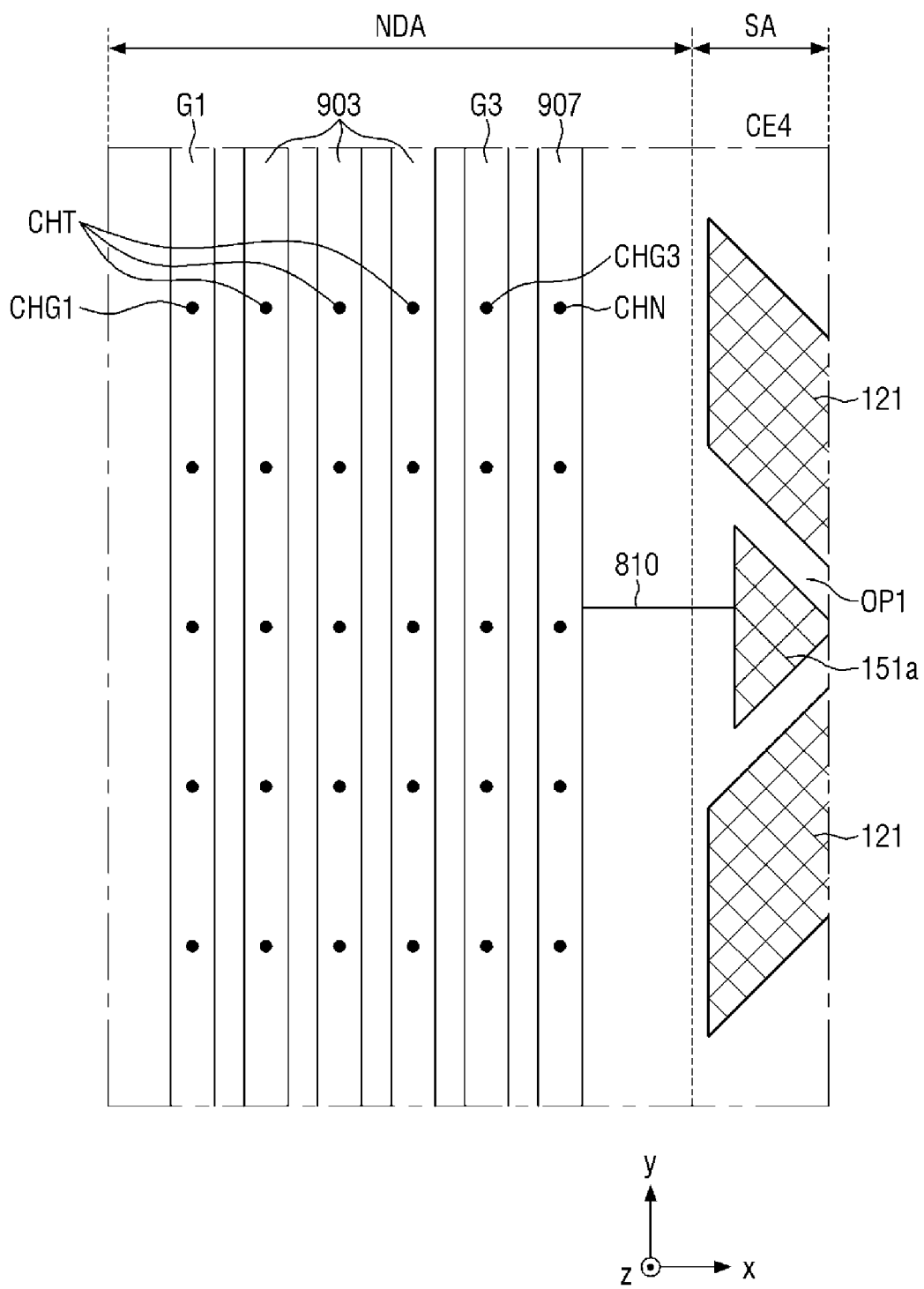
FIG. 30 is an enlarged plan view of portion Qb of FIG. 4 according to another exemplary embodiment.
Figure 31:
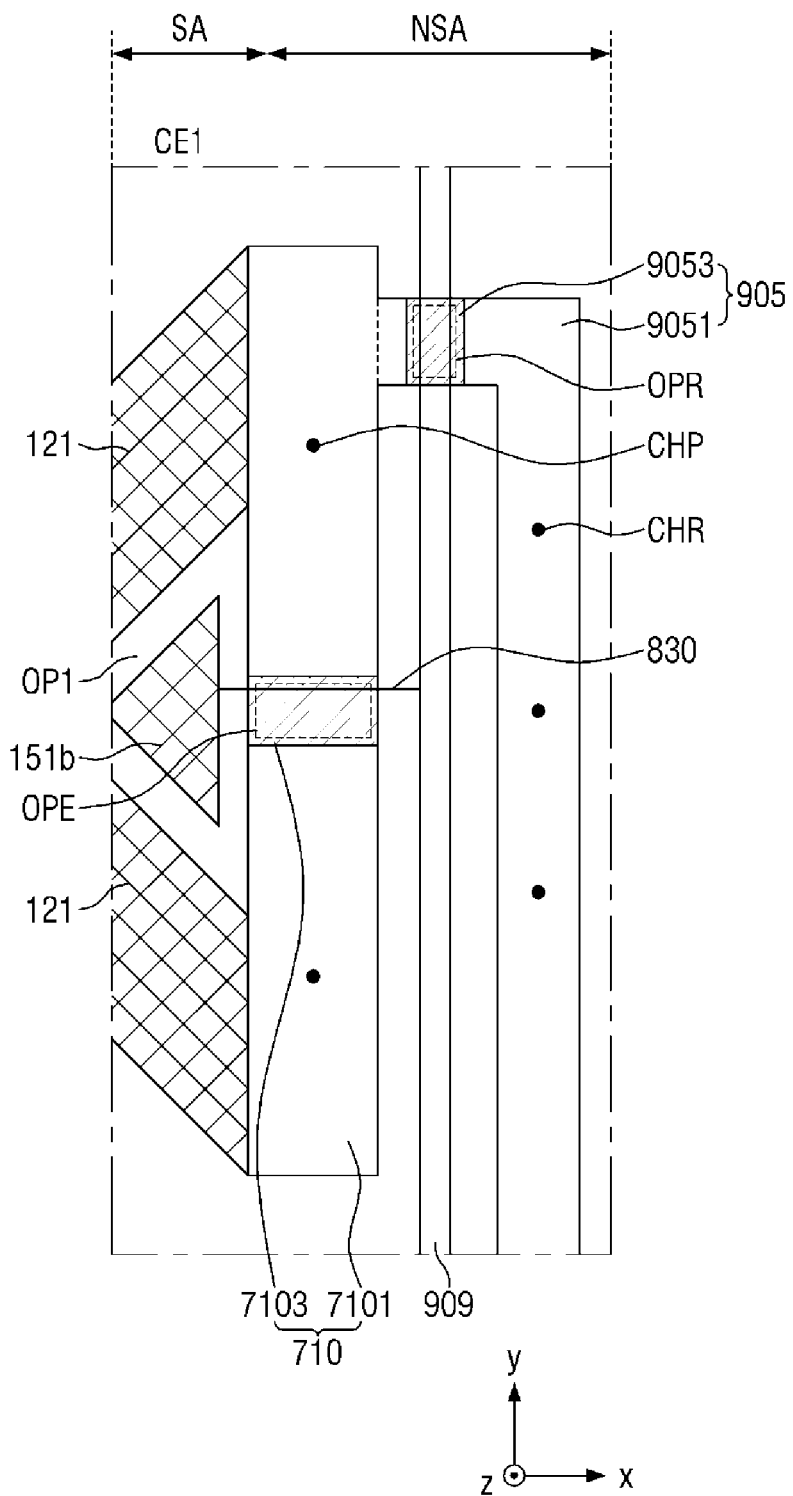
FIG. 31 is an enlarged plan view of portion Qc of FIG. 4 according to another exemplary embodiment.

FIG. 30 is an enlarged plan view of portion Qb of FIG. 4 according to another exemplary embodiment. More specifically, FIG. 30 illustrates a first touch electrode and a conductive pattern having a mesh structure. FIG. 31 is an enlarged plan view of portion Qc of FIG. 4 according to another exemplary embodiment. More specifically, FIG. 31 illustrates a first touch electrode and a conductive pattern having a mesh structure.

Referring to FIGS. 30 and 31, a first touch electrode 121, a first conductive pattern 151a, and a second conductive pattern 151b may have a mesh structure as described above. When the first conductive pattern 151a has a mesh structure, a first connection pattern 810 may be a linear pattern extending from the first conductive pattern 151a as illustrated in FIG. 30, and a second connection pattern 830 may also be a linear pattern extending from the second conductive pattern 151b.

Other components are substantially the same as those described above with reference to FIGS. 23 through 29, and thus, repeated description thereof will be omitted to avoid redundancy.

Figure 32:
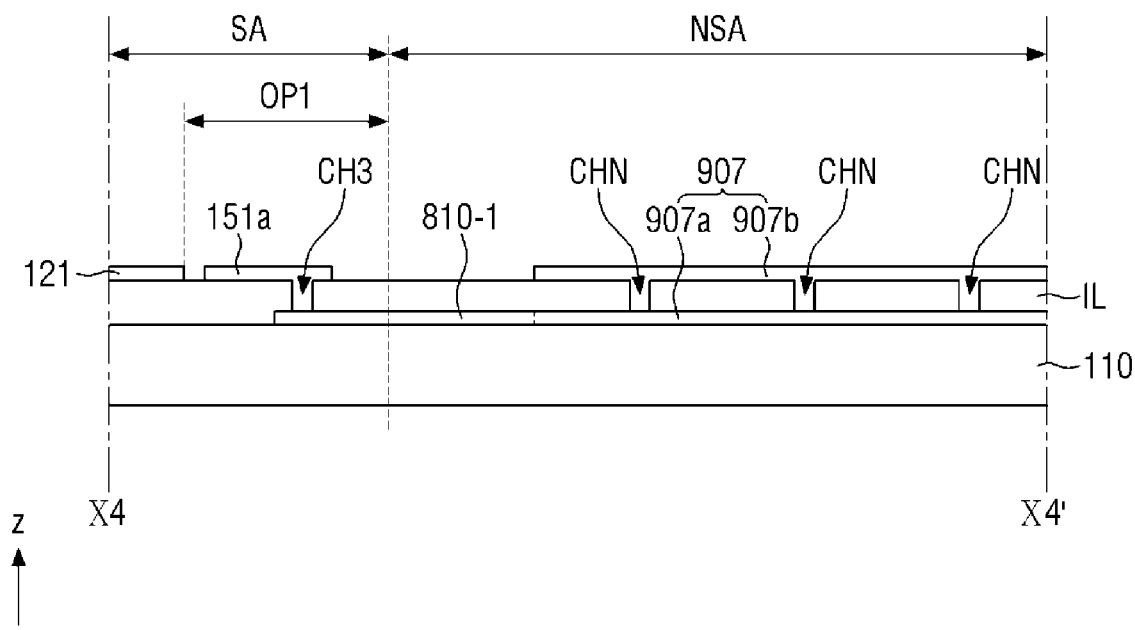
FIG. 32 is a cross-sectional view taken along X4-X4' of FIG. 23 according to another exemplary embodiment.
Figure 33:
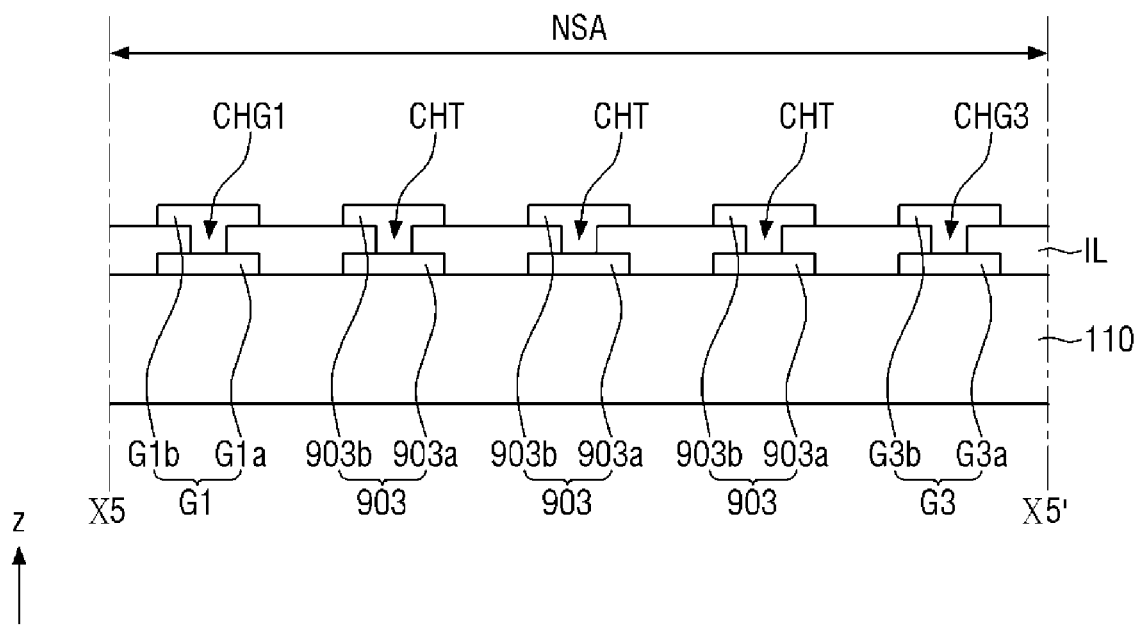
FIG. 33 is a cross-sectional view taken along X5-X5' of FIG. 23 according to another exemplary embodiment.
Figure 34:
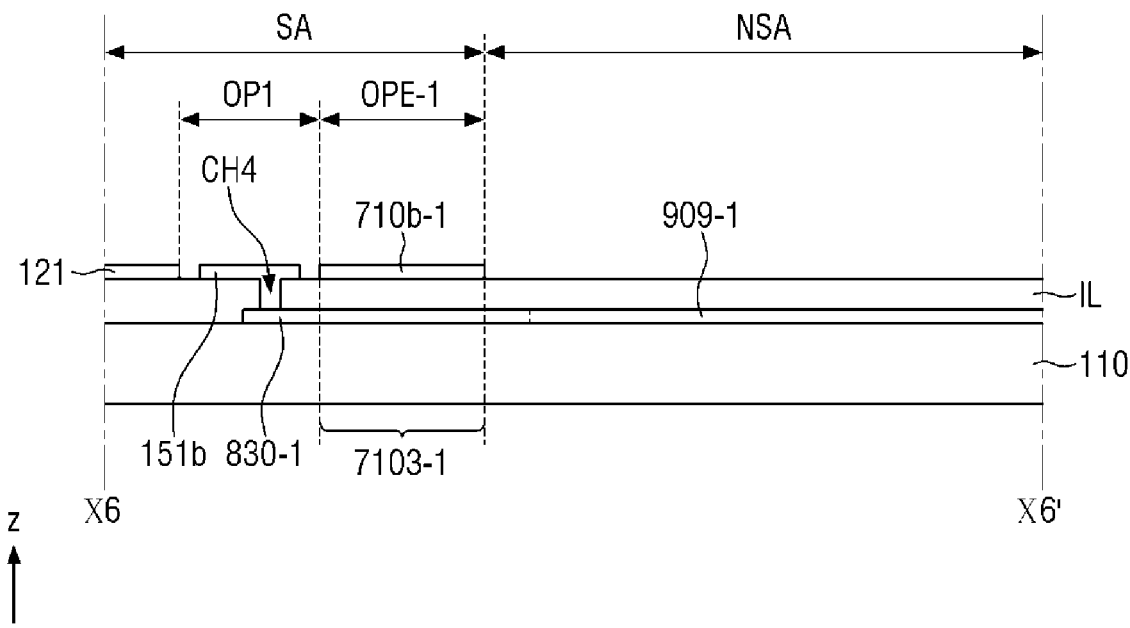
FIG. 34 is a cross-sectional view taken along X6-X6' of FIG. 26 according to another exemplary embodiment.
Figure 35:
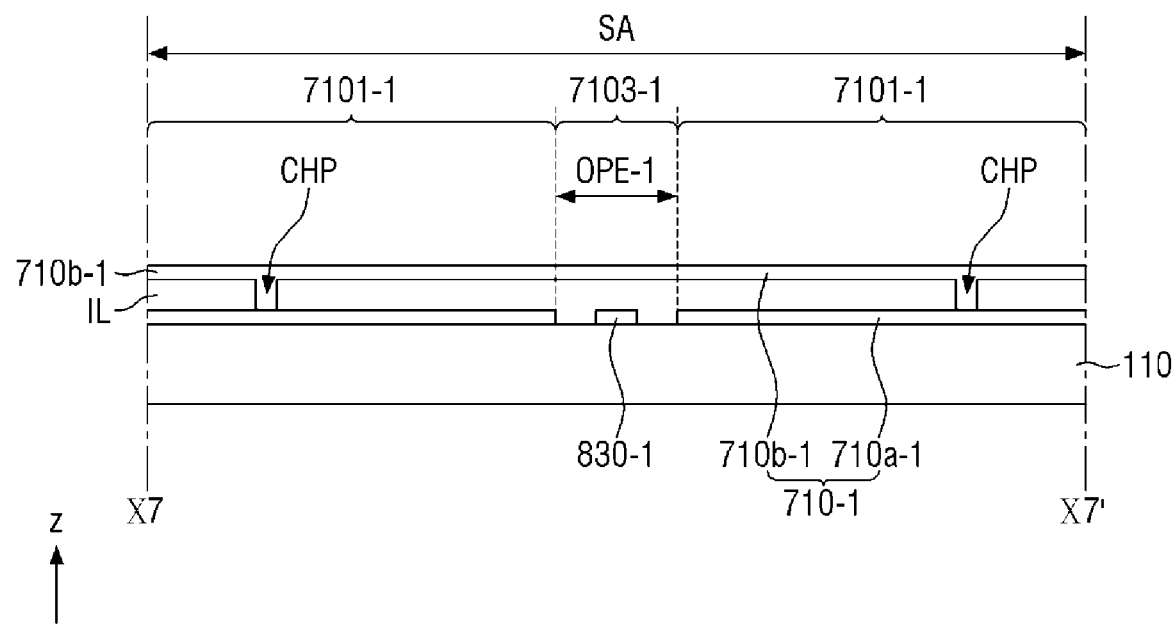
FIG. 35 is a cross-sectional view taken along X7-X7' of FIG. 26 according to another exemplary embodiment.
Figure 36:
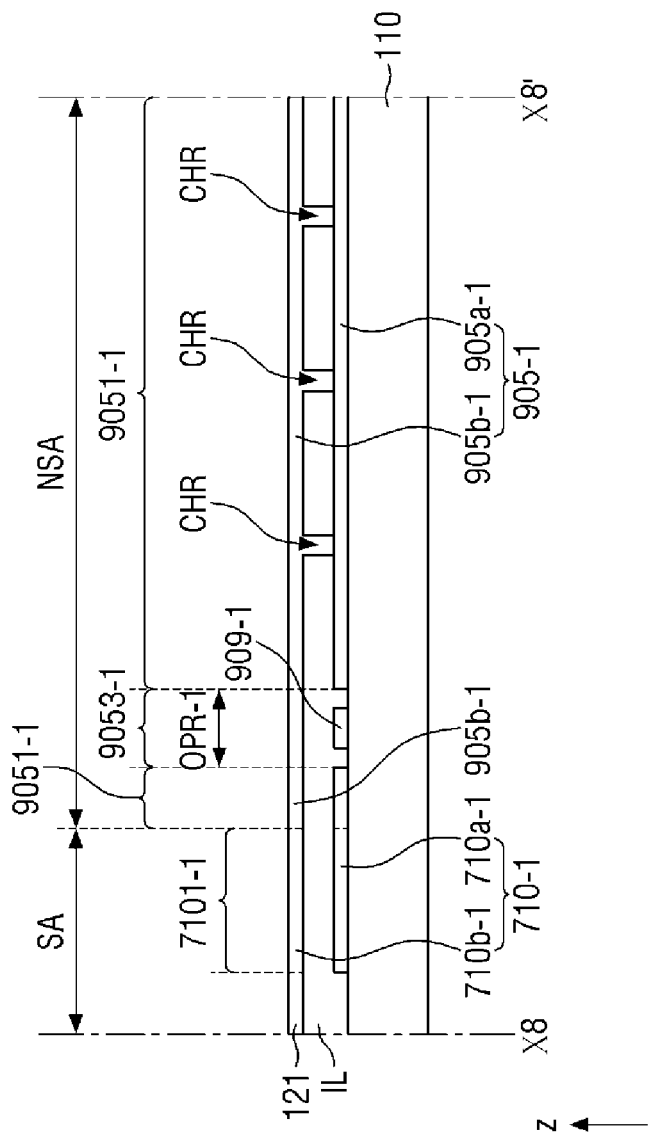
FIG. 36 is a cross-sectional view taken along X8-X8' of FIG. 26 according o another exemplary embodiment.

FIG. 32 is a cross-sectional view taken along X4-X4' of FIG. 23 according to another exemplary embodiment. FIG. 33 is a cross-sectional view taken along X5-X5' of FIG. 23 according to another exemplary embodiment. FIG. 34 is a cross-sectional view taken along X6-X6' of FIG. 26 according to another exemplary embodiment. FIG. 35 is a cross-sectional view taken along X7-X7' of FIG. 26 according to another exemplary embodiment. FIG. 36 is a cross-sectional view taken along X8-X8' of FIG. 26 according to another exemplary embodiment.

Referring to FIGS. 32 through 36, a first connection pattern 810-1, a second connection pattern 830-1, and a conductive member connecting wiring 909-1 may be made of a second conductive layer L2 (see FIG. 3), unlike those shown in FIGS. 23 and 24.

The first connection pattern 810-1 may be connected to a first conductive pattern 151a and a noise signal wiring 907. In some exemplary embodiments, the first connection pattern 810-1 may be connected to the first conductive pattern 151a through a third contact hole CH3 formed in an insulating layer IL, and a fourth lower wiring 907a of the noise signal wiring 907 may be connected to the first connection pattern 810-1.

The second connection pattern 830-1 may be connected to a second conductive pattern 151b and the conductive member connecting wiring 909-1. In some exemplary embodiments, the second connection pattern 830-1 may be connected to the second conductive pattern 151b through a fourth contact hole CH4 formed in the insulating layer IL, and the conductive member connecting wiring 909-1 made of the second conductive layer L2 (see FIG. 3) may be connected to the second connection pattern 830-1.

A first contact electrode 710-1 may include a first portion 7101-1 and a second portion 7103-1. The first portion 7101-1 may be a portion on which a first lower contact electrode 710a-1 and a first upper contact electrode 710b-1 are disposed in plan view, or may be a portion on which the first lower contact electrode 710a-1 and the first upper contact electrode 710b-1 overlap each other along the third direction z. The second portion 7103-1 may be a portion on which the first upper contact electrode 710b-1 is disposed without the first lower contact electrode 710a-1 in plan view, or may be a portion formed by removing a portion of the first lower contact electrode 710a-1. In particular, an electrode opening OPE-1 may be formed in the second portion 7103-1 by removing a portion of the first lower contact electrode 710a-1.

A third touch signal wiring 905-1 may include a first portion 9051-1 and a second portion 9053-1. The first portion 9051-1 may be a portion on which a third lower wiring 905a-1 and a third upper wiring 905b-1 are disposed in plan view, or may be a portion on which the third lower wiring 905a-1 and the third upper wiring 905b-1 overlap each other along the third direction z. In particular, the first portion 9051-1 may include both the third lower wiring 905a-1 and the third upper wiring 905b-1. The second portion 9053-1 may be a portion on which only the third upper wiring 905b-1 is disposed without the third lower wiring 905a-1, or may be a portion in which the wiring opening OPR-1 is formed by removing a portion of the third lower wiring 905a-1. In particular, the second portion 9053-1 may include the third upper wiring 905b-1 and may not include the third lower wiring 905a-1.

The conductive member connecting wiring 909-1 may cross the second portion 9053-1 of the third touch signal wiring 905-1. More particularly, a portion of the conductive member connecting wiring 909-1 may be located in the wiring opening OPR-1. Accordingly, the conductive member connecting wiring 909-1 and the third touch signal wiring 905-1 may be separated without being connected to each other.

The second connection pattern 830-1 may cross the second portion 7103-1 of the first contact electrode 710-1. In particular, at least a portion of the second connection pattern 830-1 may be located in the electrode opening OPE-1. Accordingly, the second connection pattern 830-1 and the first contact electrode 710-1 may be separated without being connected to each other.

Other components are substantially the same as those described above with reference to FIGS. 23 through 29, and thus, repeated descriptions thereof will be omitted to avoid redundancy.

Hereinafter, a touch position detection operation of the touch sensor TSM will be described with reference to FIGS. 37 and 38.

Figure 37:
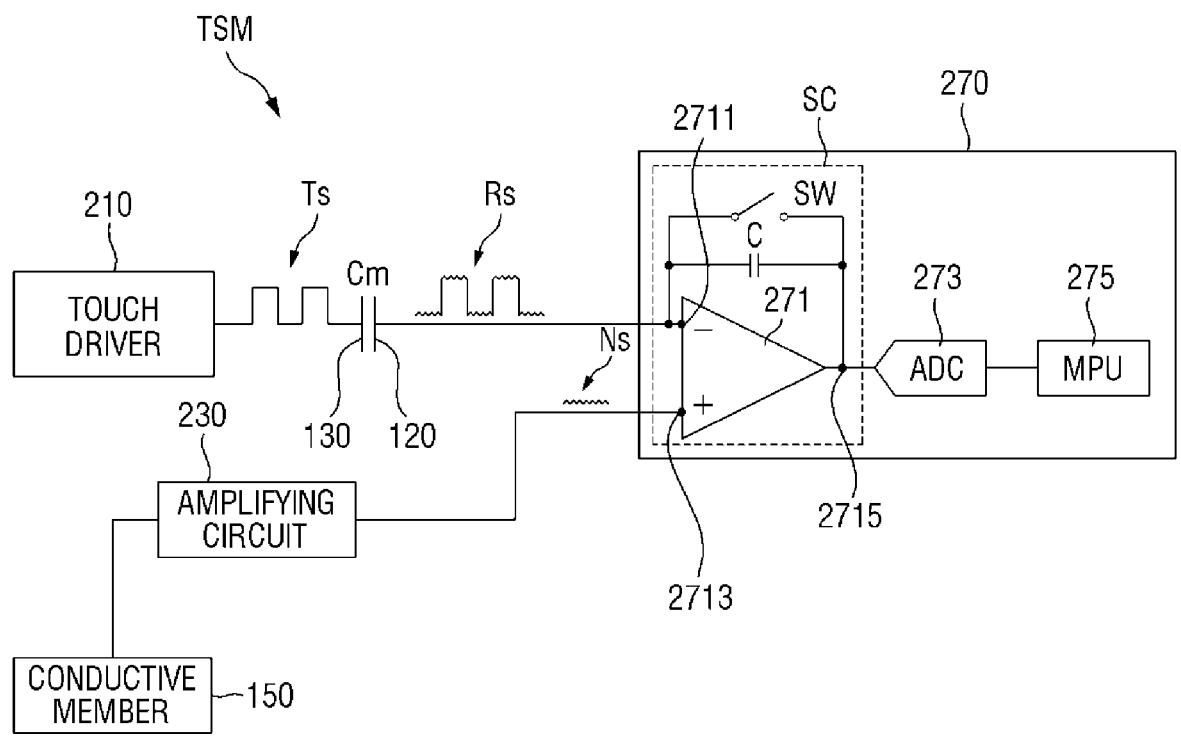
FIG. 37 is a diagram for schematically explaining a touch position detection operation of the touch sensor according to an exemplary embodiment.

FIG. 37 is a diagram for explaining a touch position detection operation of the touch sensor TSM according to an exemplary embodiment. FIG. 38 illustrates the connection relationship between the sensor unit 100 and the touch controller 200 according to an exemplary embodiment. The contact electrodes 710, 730, and 750 illustrated in FIG. 4, etc. are omitted from FIG. 38, for convenience of description.

Figure 38:
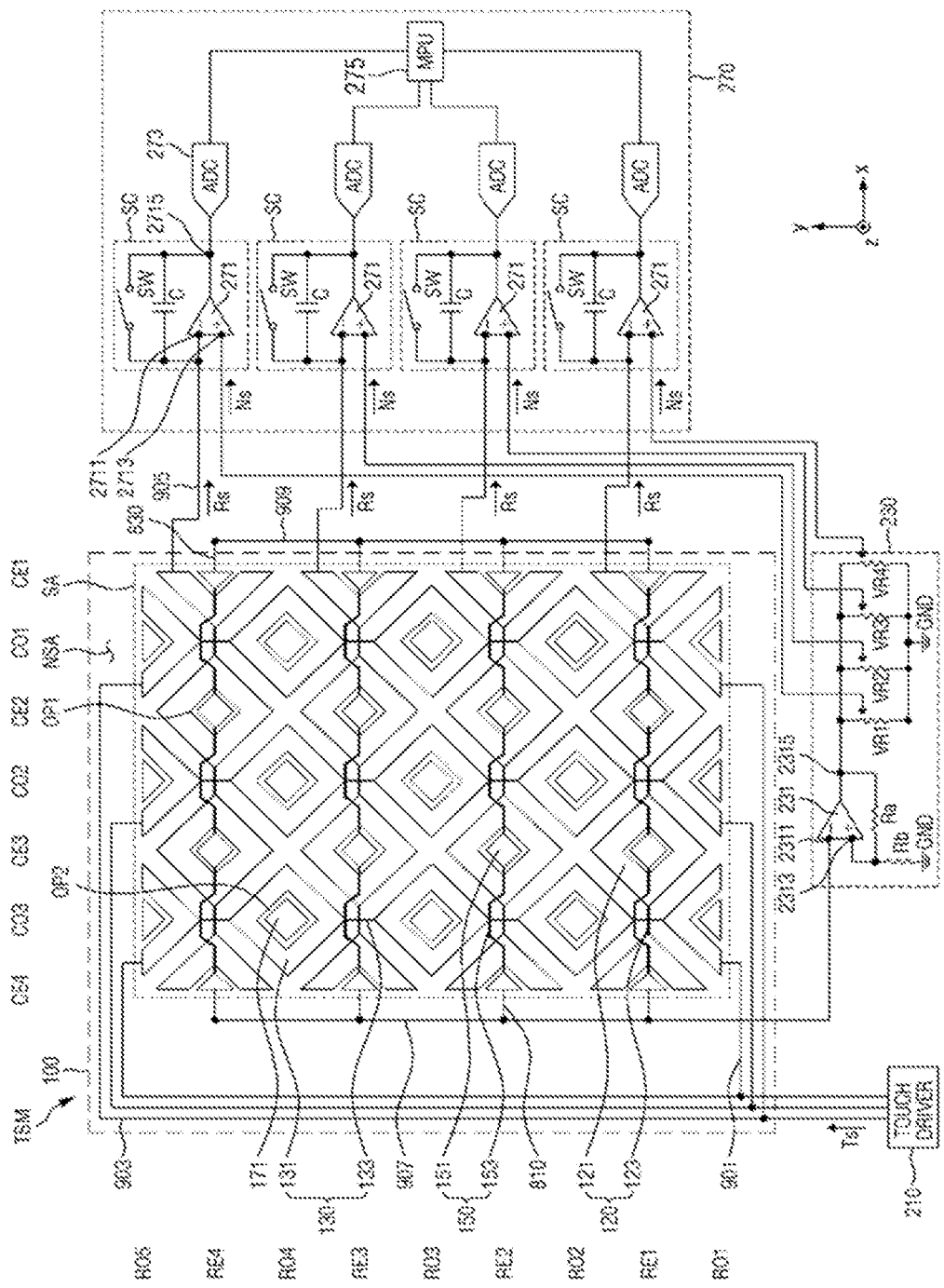
FIG. 38 illustrates the connection relationship between the sensor unit and the touch controller according to an exemplary embodiment.

Referring to FIGS. 37 and 38, the touch driver 210 may provide a driving signal Ts to the second touch electrode members 130 through the first touch signal wirings 901 and the second touch signal wirings 903. In some exemplary embodiments, the driving signal Ts may be sequentially provided to each of the second touch electrode members 130.

The touch detector 270 may receive a sensing signal Rs from each of the first touch electrode members 120 through the third touch signal wirings 905. In some exemplary embodiments, the sensing signal Rs may include information about a change in mutual capacitance between a first touch electrode member 120 and a second touch electrode member 130. When the driving signal Ts is provided to each of the second touch electrode members 130, mutual capacitance Cm is formed between each second touch electrode member 130 and each first touch electrode member 120. When a touch event such as a touch input occurs, the mutual capacitance Cm may change. Each of the first touch electrode members 120 may output the sensing signal Rs corresponding to the driving signal Ts, and the sensing signal Rs output from each of the first touch electrode members 120 may be input to the touch detector 270. In some exemplary embodiments, the sensing signal Rs may include information about the change in the mutual capacitance Cm.

In some exemplary embodiments, the touch detector 270 may include a plurality of sensing channels SC electrically connected to the first touch electrode members 120, respectively. In addition, the touch detector 270 may include at least one ADC 273 connected to each of the sensing channels SC and a processor 275. Hereinafter, the sensing channels SC and the ADCs 273 will be described as separate components, however, the ADC 273 may be included in each sensing channel SC in some exemplary embodiments.

The sensing channels SC may receive the sensing signals Rs from the first touch electrode members 120, amplify the received sensing signals Rs, and output the amplified sensing signals Rs. In some exemplary embodiments, each of the sensing channels SC may include an analog front end including at least one amplifier 271, such as an operational amplifier (OP amp).

The amplifier 271 may include a first input terminal 2711, a second input terminal 2713, and an output terminal 2715. According to an exemplary embodiment, the first input terminals 2711 of the amplifiers 271 (e.g., inverted input terminals of OP amps) may be electrically connected to the first touch electrode members 120 by the third touch signal wirings 905, and the sensing signals Rs may be input to the first input terminals 2711, respectively.

In some exemplary embodiments, the second input terminals 2713 of the amplifiers 271 (e.g., non-inverted input terminals of the OP amps) may be electrically connected to the conductive members 150 or the amplifying circuit 230 by the noise signal wiring 907, and noise signals Ns output from the conductive members 150 may be provided to the second input terminals 2713 of the amplifiers 271, respectively. Accordingly, reference voltages of the amplifiers 271 may vary according to voltage variations of the conductive members 150, respectively. In particular, reference potentials of the amplifiers 271 may vary according to electric potentials (voltage levels) of the conductive members 150, respectively.

The electric potential of each of the conductive members 150 may vary according to a noise signal introduced from, e.g., the display panel 300 to the sensor unit 100. For example, the electric potential of each of the conductive members 150 may vary according to a common mode noise introduced from, e.g., the display panel 300 to the sensor unit 100.

As such, if the conductive members 150 are further disposed in the sensing area SA and the reference potentials of the amplifiers 271 are changed using the noise signals Ns output from the conductive members 150, the common mode noise introduced to the sensor unit 100 can be canceled (or eliminated). Specifically, the first touch electrode members 120 and the conductive members 150, which are sensing electrode members, may have ripples corresponding to each other in response to the common mode noise. In particular, since the first touch electrode members 120 and the conductive members 150 extend substantially in the same direction in the sensing area SA, and are arranged at positions corresponding to each other, they receive noise signals of the same or substantially similar in shapes and/or sizes. In addition, the first touch electrode members 120 are electrically connected to the first input terminals 2711 of the amplifiers 271 by the third touch signal wirings 905, and the conductive members 150 are electrically connected to the second input terminals 2713 of the amplifiers 271 by the noise signal wiring 907 different from the third touch signal wirings 905. In particular, the noise signals Ns are provided to the amplifiers 271 through a different path from the sensing signals Rs. Therefore, noise components (ripples) included in the sensing signals Rs provided from the first touch electrode members 120 can be effectively canceled. Accordingly, signals output from the output terminals 2715 of the amplifiers 271 may be noise-removed sensing signals.

In some exemplary embodiments, each of the sensing channels SC may further include a capacitor C and a reset switch SW connected in parallel to each other between the first input terminal 2711 and the output terminal 2715 of the amplifier 271.

In FIGS. 37 and 38, each of the amplifiers 271 may be an inverting amplifier. However, the inventive concepts are not limited thereto, and each of the amplifiers 271 may be implemented as a non-inverting amplifier in some exemplary embodiments.

The output terminals 2715 of the amplifiers 271 may be electrically connected to the ADCs 273.

Each of the ADCs 273 may convert an input analog signal into a digital signal. According to an exemplary embodiment, the number of the ADCs 273 may be equal to the number of the first touch electrode members 120 so that the ADCs 273 can correspond one-to-one to the first touch electrode members 120. Alternatively, in an exemplary embodiment, the first touch electrode members 120 may be configured to share one ADC 273. In this case, a switch circuit for selecting a sensing channel may be further provided.

The processor 275 processes a converted signal (digital signal) received from each of the ADCs 273 and detects a touch input based on the signal processing result. For example, the processor 275 may comprehensively analyze a sensing signal amplified by each amplifier 271 and converted by each ADC 273 to detect the occurrence of a touch input and the position of the touch input. According to an exemplary embodiment, the processor 275 may be implemented as a microprocessor (MPU). In this case, a memory required for driving the processor 275 may be additionally provided in the touch detector 270. However, the inventive concepts are not limited to a particular configuration of the processor 275. For example, the processor 275 may be implemented as a microcontroller (MCU).

The touch controller 200 may further include the amplifying circuit 230 connected between the second input terminals 2713 of the sensing channels SC and the conductive members 150. According to an exemplary embodiment, the amplifying circuit 230 may include at least one amplifier 231. According to an exemplary embodiment, the amplifier 231 may include a first input terminal 2311 commonly connected to the conductive members 150 by the noise signal wiring 907 and a second input terminal 2313 connected to an output terminal 2315 via at least one resistor Ra. According to an exemplary embodiment, the first input terminal 2311 and the second input terminal 2313 may be an inverted input terminal and a non-inverted input terminal, respectively. For reference, Ra and Rb in FIG. 38 indicate input and output impedances of the amplifier 231.

The amplifying circuit 230 receives the noise signals Ns from the conductive members 150, amplifies the noise signals Ns to a gain value of the amplifier 231, and outputs the amplified noise signals Ns to the sensing channels SC, respectively. Here, the magnitudes of the noise signals Ns to be input to the sensing channels SC can be easily adjusted by adjusting the gain value of the amplifying circuit 230. In some exemplary embodiments, the gain value of the amplifying circuit 230 may be adjusted, such that noise components included in the sensing signals Rs output from the first touch electrode members 120 can be effectively canceled in the sensing channels SC.

According to an exemplary embodiment, the amplifying circuit 230 may further include a plurality of variable resistors VR1 through VR4 connected in parallel to each other between the output terminal 2315 of the amplifier 231 and a predetermined reference power source GND, such as a ground power source. For example, the amplifying circuit 230 may include a plurality of resistors VR1 through VR4 corresponding to the number of the sensing channels SC.

According to an exemplary embodiment, the sensing channels SC may respectively be connected to different variable resistors VR1 through VR4 provided in the amplifying circuit 230. For example, the second input terminal 2713 of a first sensing channel SC corresponding to the fourth electrode row RE4 in FIG. 38 may be connected to a first variable resistor VR1, and the second input terminal 2713 of a second sensing channel SC corresponding to the third electrode row RE3 may be connected to a second variable resistor VR2. In addition, the second input terminal 2713 of a third sensing channel SC corresponding to the second electrode row RE2 may be connected to a third variable resistor VR3, and the second input terminal 2713 of a fourth sensing channel SC corresponding to the first electrode row RE1 may be connected to a fourth variable resistor VR4.

According to the illustrated exemplary embodiment, the gain value of a noise signal Ns input to the second input terminal 2713 of each sensing channel SC may be independently adjusted according to the magnitude of a noise component included in a sensing signal Rs input to the sensing channel SC. For example, the gain values of the noise signals Ns input to the sensing channels SC respectively connected to the first touch electrode members 120 may be applied differently, according to the positions of the first touch electrode members 120. For example, the magnitudes of the noise signals Ns introduced to the sensor unit 100 may change from the fourth electrode row RE4 toward the first electrode row RE1 formed by the first touch electrode members 120. In this case, when the magnitudes of the noise signals Ns introduced to the sensor unit 100 gradually decrease from the fourth electrode row RE4 toward the first electrode row RE1, the gain values of the noise signals Ns may be gradually reduced from the first sensing channel SC connected to the first sensing electrode member 120 of the fourth electrode row RE4 toward the last sensing channel SC connected to the first touch electrode member 120 of the first electrode row RE1. Accordingly, the gain values of the noise signals Ns can be independently adjusted according to vertical positions (e.g., Y coordinates) of the first touch electrode members 120 in the sensor unit 100 in order to more effectively cancel the noise components included in the sensing signals Rs.

In addition, according to the illustrated exemplary embodiment, during a period in which the second touch electrode members 130 are sequentially driven, the gain values of the noise signals Ns may also be independently adjusted in each sub-period, during which a second touch electrode member 130 is driven, by adjusting resistance values of the variable resistors VR1 through VR4 in each sub-period. Accordingly, a difference in the magnitude of noise between horizontal positions (e.g., X coordinates) in the sensor unit 100 can be compensated for. Therefore, the noise components included in the sensing signals Rs according to an exemplary embodiment can be more accurately and effectively canceled.

Since the conductive member connecting wiring 909 connected to all of the conductive members 150 is disposed to oppose the noise signal wiring 907, the RC delay of the noise signals Ns output from the conductive members 150 can be reduced.

The touch sensor TSM according to exemplary embodiments can effectively cancel a noise signal introduced from, e.g., the display panel 300 and improve a signal-to-noise ratio (SNR). Accordingly, the malfunction of the touch sensor TSM due to the noise signal can be minimized, and the sensing sensitivity of the touch sensor TSM can be improved.

In addition, since the conductive member connecting wiring 909 connected to all of the conductive members 150 is disposed to oppose the noise signal wiring 907 in the touch sensor TSM, the RC delay of the noise signals Ns output from the conductive members 150 can be reduced.

Furthermore, since conductive members, wirings, contact electrodes, and connection patterns are formed together in the process of manufacturing touch electrode members, the thickness of a touch sensor is not increased, and process efficiency is improved.

In this manner, it is possible to provide a touch sensor with improved sensitivity and a display device including the touch sensor.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A touch sensor comprising:
a base layer;
a first touch electrode member comprising a plurality of first touch electrodes disposed on the base layer, the first touch electrodes arranged along a first direction and electrically connected to each other, each first touch electrode comprising a first opening;
a second touch electrode member comprising a plurality of second touch electrodes disposed on the base layer, the second touch electrodes arranged along a second direction intersecting the first direction and electrically connected to each other;
a conductive member comprising a plurality of conductive patterns electrically connected to each other along the first direction and respectively disposed in the first openings;
a contact electrode connected to one end of the first touch electrode member and comprising a lower contact electrode and an upper contact electrode; and
a connection pattern connected to a first conductive pattern of the conductive patterns disposed at an outermost position along the first direction, the connection pattern comprising the same conductive layer as the upper contact electrode,
wherein the upper contact electrode includes an electrode opening, and a portion of the connection pattern is disposed in the electrode opening.

2. The touch sensor of claim 1, wherein:
the first touch electrode member further comprises a first connection portion connecting two neighboring first touch electrodes to each other along the first direction;
the second touch electrode member further comprises a second connection portion connecting two neighboring second touch electrodes to each other along the second direction, the second connection portion insulated from the first connection portion;
the conductive member further comprises a connection line connecting two neighboring conductive patterns to each other along the first direction;
the first touch electrodes, the second touch electrodes, the conductive patterns, the connection pattern, and the upper contact electrode comprise a first conductive layer;
one of the first connection portion and the second connection portion comprises a second conductive layer different from the first conductive layer, and the other one of the first connection portion and the second connection portion comprises the first conductive layer; and
the connection line and the lower contact electrode comprise the second conductive layer.

3. The touch sensor of claim 2, further comprising an insulating layer disposed on the base layer,
wherein the connection line and the lower contact electrode are disposed on the base layer, the insulating layer is disposed on the connection line and the lower contact electrode, and the connection pattern and the upper contact electrode are disposed on the insulating layer.

4. The touch sensor of claim 1, further comprising:
a touch signal wiring connected to the contact electrode; and
a conductive member connecting wiring connected to the connection pattern and intersecting the touch signal wiring,
wherein at least a portion of the conductive member connecting wiring is disposed between the contact electrode and the touch signal wiring.

5. The touch sensor of claim 4, wherein:
the touch signal wiring comprises a lower wiring and an upper wiring, the upper wiring connected to the lower wiring and includes a wiring opening;
the conductive member connecting wiring, the upper wiring, and the connection pattern comprise the first conductive layer, the lower wiring comprises the second conductive layer; and
a portion of the conductive member connecting wiring is formed in the wiring opening.

6. The touch sensor of claim 5, further comprising an insulating layer disposed on the base layer and including a contact hole,
wherein:
the lower wiring is disposed on the base layer, the insulating layer is disposed on the lower wiring, the conductive member connecting wiring, the connection pattern, and the upper wiring are disposed on the insulating layer; and
the upper wiring is connected to the lower wiring through the contact hole.

7. The touch sensor of claim 6, wherein the base layer comprises a first encapsulating inorganic layer, an encapsulating organic layer disposed on the first encapsulating inorganic layer, and a second encapsulating inorganic layer disposed on the encapsulating organic layer.

8. The touch sensor of claim 5, wherein the lower wiring is connected to the lower contact electrode, and the upper wiring is connected to the upper contact electrode.

9. The touch sensor of claim 1, wherein each of the second touch electrodes comprises a second opening, and the area of each of the second openings is larger than that of each of the first openings.

10. The touch sensor of claim 9, further comprising a plurality of conductors disposed in the second openings and spaced apart from the second touch electrodes, respectively, wherein the conductors comprise the same first conductive layer as the conductive patterns and the connection pattern.

11. The touch sensor of claim 1, further comprising:
a touch driver configured to provide a driving signal to the second touch electrodes; and
a touch detector configured to receive a sensing signal generated in response to the driving signal from the first touch electrode member, receive a noise signal from the conductive member, and cancel noise of the sensing signal based on the noise signal.

12. The touch sensor of claim 11, further comprising an amplifying circuit connected between the touch detector and the conductive member,
wherein the amplifying circuit comprises an amplifier electrically connected to the conductive member, and a plurality of variable resistors connected in parallel to an output terminal of the amplifier.

13. A touch sensor comprising:
a base layer;
a first touch electrode member comprising a plurality of first touch electrodes disposed on the base layer, the first touch electrodes arranged along a first direction and electrically connected to each other, each first touch electrode comprising a first opening;
a second touch electrode member comprising a plurality of second touch electrodes disposed on the base layer, the second touch electrodes arranged along a second direction intersecting the first direction and electrically connected to each other;
a conductive member comprising a plurality of conductive patterns electrically connected to each other along the first direction and respectively disposed in the first openings;
a contact electrode connected to one end of the first touch electrode member and comprising a lower contact electrode and an upper contact electrode; and
a connection pattern connected to a first conductive pattern of the conductive patterns disposed at an outermost position along the first direction, the connection pattern comprising the same conductive layer as the lower contact electrode,
wherein the lower contact electrode includes an electrode opening, and a portion of the connection pattern is disposed in the electrode opening.

14. The touch sensor of claim 13, wherein:
the first touch electrode member further comprises a first connection portion connecting two neighboring first touch electrodes to each other along the first direction;
the second touch electrode member further comprises a second connection portion connecting two neighboring second touch electrodes to each other along the second direction, the second connection portion insulated from the first connection portion;
the conductive member further comprises a connection line connecting two neighboring conductive patterns to each other along the first direction;
the first touch electrodes, the second touch electrodes, the conductive patterns, and the upper contact electrode comprise a first conductive layer;
any one of the first connection portion and the second connection portion comprises a second conductive layer different from the first conductive layer, the other one of the first connection portion and the second connection portion comprises the first conductive layer; and
the connection line, the connection pattern and the lower contact electrode comprise the second conductive layer.

15. The touch sensor of claim 14, further comprising an insulating layer disposed on the base layer,
wherein the connection line, the connection pattern, and the lower contact electrode are disposed on the base layer, the insulating layer is disposed on the connection line, the connection pattern, and the lower contact electrode, and the upper contact electrode and the conductive patterns are disposed on the insulating layer.

16. The touch sensor of claim 15, wherein the conductive pattern is connected to the connection pattern through a contact hole formed in the insulating layer.

17. The touch sensor of claim 13, further comprising:
a touch signal wiring connected to the contact electrode; and
a conductive member connecting wiring connected to the connection pattern and intersects the touch signal wiring,
wherein:
the touch signal wiring comprises a lower wiring and an upper wiring, the upper wiring connected to the lower wiring and including a wiring opening;
the upper wiring comprises the first conductive layer;
the conductive member connecting wiring, the connection pattern, and the lower wiring comprise the second conductive layer; and
a portion of the conductive member connecting wiring is formed in the wiring opening.

18. The touch sensor of claim 17, further comprising an insulating layer disposed on the base layer,
wherein the conductive member connecting wiring, the connection pattern, and the lower wiring are disposed on the base layer, the insulating layer is disposed on the conductive member connecting wiring, the connection pattern, and the lower wiring, the upper wiring is disposed on the insulating layer, and the upper wiring is connected to the lower wiring through a contact hole formed in the insulating layer.

19. A display device comprising:
a base substrate including a sensing area and a peripheral area;
a light emitting element disposed on the base substrate;
an inorganic layer disposed on the light emitting element;
a touch electrode disposed on the inorganic layer in the sensing area, the touch electrode being disposed within the sensing area and comprising an opening;
a conductive member comprising a conductive pattern located within the opening in the sensing area and spaced apart from the touch electrode;

a touch signal wiring disposed on the inorganic layer in the peripheral area and electrically connected to the touch electrode; and a conductive member connecting wiring disposed on the inorganic layer in the peripheral area, electrically connected to the conductive pattern, and intersecting the touch signal wiring, wherein:

the touch signal wiring comprises:

an upper wiring comprising the same first conductive layer as the touch electrode and the conductive pattern; and a lower wiring comprising a second conductive layer different from the first conductive layer, the lower wiring disposed directly on the inorganic layer;

any one of the upper wiring and the lower wiring includes a wiring opening; and at least a portion of the conductive member connecting wiring is disposed in the wiring opening and is insulated from the touch signal wiring.

20. The display device of claim 19, wherein the conductive member connecting wiring comprises the same conductive layer as the upper or lower wiring having the wiring opening.

* * * * *